United States Patent
Schepens et al.

(10) Patent No.: US 8,203,880 B2
(45) Date of Patent: Jun. 19, 2012

(54) BINARY LOGIC UTILIZING MEMS DEVICES

(75) Inventors: Cornelius Petrus Elisabeth Schepens, Beuningen (NL); Cong Quoc Khieu, San Jose, CA (US); Robertus Petrus van Kampen, Hertogenbosch (NL)

(73) Assignee: Cavendish Kinetics Inc., San Jose, CA (US)

( * ) Notice: Subject to any disclaimer, the term of this patent is extended or adjusted under 35 U.S.C. 154(b) by 223 days.

(21) Appl. No.: 12/818,293

(22) Filed: Jun. 18, 2010

(65) Prior Publication Data

US 2011/0002168 A1 Jan. 6, 2011

Related U.S. Application Data

(60) Provisional application No. 61/222,476, filed on Jul. 1, 2009.

(51) Int. Cl.
*G11C 11/34* (2006.01)

(52) U.S. Cl. ............... 365/185.08; 365/185.05; 365/154

(58) Field of Classification Search ............. 365/185.08, 365/185.05, 154, 185.2, 189.07, 51, 185.18, 365/185.23, 63, 185.11, 185.24, 230.03
See application file for complete search history.

(56) References Cited

U.S. PATENT DOCUMENTS

| | | | |
|---|---|---|---|
| 5,065,362 A | 11/1991 | Herdt et al. | |
| 5,602,776 A | 2/1997 | Herdt et al. | |
| 5,914,895 A | 6/1999 | Jenne | |
| 5,986,932 A | 11/1999 | Ratnakumar et al. | |
| 6,026,018 A | 2/2000 | Herdt et al. | |
| 6,097,629 A | 8/2000 | Dietrich et al. | |
| 6,414,873 B1 | 7/2002 | Herdt | |
| 6,543,087 B2 * | 4/2003 | Yeh et al. | 16/292 |
| 6,576,962 B2 | 6/2003 | Rockett | |
| 7,280,397 B2 | 10/2007 | Scheuerlein | |
| 2009/0273962 A1 * | 11/2009 | van Kampen | 365/72 |

OTHER PUBLICATIONS

Tsai et al., "Design and fabrication of MES logic gates", J. Micromech. Microeng. 18 (2008) 045001 (10pp).

* cited by examiner

*Primary Examiner* — Dang Nguyen
(74) *Attorney, Agent, or Firm* — Patterson & Sheridan, LLP

(57) ABSTRACT

Embodiments disclosed herein generally relate to switches that utilize micro-electromechanical systems (MEMS). By replacing transistors in many devices with switches such as MEMS switches, the devices may be used for logic applications. MEMS switches may be used in devices such as FPGAs, NAND devices, nvSRAM devices, AMS chips and general memory logic devices. The benefit of utilizing MEMS devices in place of transistors is that the transistors utilize more space on the chip. Additionally, the MEMS devices can be formed in the BEOL without having any negative impacts on the FEOL or necessitating the use of additional layers within the chip.

20 Claims, 30 Drawing Sheets

- ❖ If there is no pull-in from contact issue
  - For R_pu = R_pd without R_off_add
    - Vout_on = VDD/2
    - Vout_off = VDD
- ❖ If there is some pull-in from contact issue
  - For R_pu = R_pd and R_off_add = 2 R_pu
    - Vout_on = 2/5 VDD
    - Vout_off = 2/3 VDD
  - For R_pu = R_pd and R_off_add = 4 R_pu
    - Vout_on = 4/9 VDD
    - Vout_off = 4/5 VDD \* Control signals and control devices are not shown; Also delay to guarantee stability is not shown.

BINARY LOGIC UTILIZING MEMS DEVICES

CROSS-REFERENCE TO RELATED APPLICATIONS

This application claims benefit of U.S. Provisional Patent Application Ser. No. 61/222,476, filed Jul. 1, 2009, which is herein incorporated by reference.

BACKGROUND OF THE INVENTION

1. Field of the Invention

Embodiments disclosed herein generally relate to switches that utilize micro-electromechanical systems (MEMS).

2. Description of the Related Art

Currently, MEMS-based non-volatile memory (NVM) design requires all peripheral circuits and the pass gate in each memory cell to be a complementary metal oxide semiconductor (CMOS) device. To further utilize the advantage of MEMS-based design between interconnect layers, one needs to be able to do all of the simple logics with MEMS-only design. At the very end, there will be the interface design between MEMS design and CMOS design. To date, MEMS-only design has not been achieved for NVM devices.

One example of a NVM device is a non-volatile static random access memory (nvSRAM). Many nvSRAM applications comprise fast unlimited as well as random read and write accesses to memory while also having protection against data loss during power failures. Such applications utilize SRAM functionality, but with non-volatile behavior. According to Web-Feet Research (April 2007) the nvSRAM market should grow at 28% CAGR to $956 million in 2012.

Today the nvSRAM market consists of three different approaches. The first approach utilizes existing non-volatile memory without SRAM, such as standard flash, electrically erasable programmable read only memory (EEPROM), flash random access memory (FRAM) and magnetoresistive random access memory (MRAM). These technologies all have limitations with respect to speed and/or endurance.

The second approach is standard SRAM memories with battery backup. However, relying on a battery is not a real fail-safe option and regular replacements of batteries is required and expensive. The third approach is standard SRAM cell architecture, but every memory cell also contains an EEPROM cell (called nvSRAM). nvSRAM can store the data at power failure and restore it at power up. Storing and restoring can also be controlled by the user. However, the memory cells are very large (i.e., about twice the size of a normal SRAM cell), while also the EEPROM process steps add additional costs, resulting in a memory with a cost price of about 3 times the cost of standard SRAM memory.

Data logging is one area where nvSRAMs are needed. Point of sale (POS) terminals/smart terminals are now able to approve payment transactions without having to obtain approval from a remote server. Because secure data resides in the terminal, a lot of time can be saved in terms of the over the air verification which is slow as well as intrusion prone.

Motor vehicle crash boxes are another area where nvSRAMs could be employed effectively. The vehicle state data at the time of the crash can go a long way in validating the claims of any party involved in the crash and finding the reason of the crash. This has huge financial implications in the insurance industry, and the concept of having crash boxes in passenger/commercial vehicles, such as the 'black box' utilized in airplanes, could become a defacto standard in the near future. nvSRAMs with their fast read/write capabilities are a good fit for these applications. Similar critical applications such as medical equipment and high-end servers can use nvSRAMs to store their data. In case of an external power failure or unforeseen calamities, nvSRAM can hold the data without external intervention. Hence, nvSRAMs provide a flexibility of an EEPROM but at SRAM speeds. Applications in environments where field service is not possible/costly such as data loggers spread across geographies, routers and equipment in in-hospitable conditions can use nvSRAMs because nvSRAM do not use batteries.

Another architecture where MEMS devices may be used is NOR architecture. MEMS NOR architecture requires at least one transistor in each memory cell. Because of the NMOS device in each memory cell, area underneath the MEMS could not be utilized. For MEMS NOR architecture, The MEMS memory cells take up 50% area of MEMS memory array area for small bit count (i.e., a few Kbits) design or a lot more (e.g. 80%) for bigger memory size. Thus, MEMS NOR architecture needs further development to utilize less of the memory array area.

Analog and mixed-signal chips are another area where MEMS devices may be used. There are many analog and mixed-signals chips, which require some form of fine-tuning to achieve a proper functioning of the device within its specifications. Some examples of devices that typically require fine-tuning are: DA and AD converters, operational amplifiers, filters, digital potentiometers, etc. This fine-tuning usually requires redefining the value of one or more resistors and capacitors and occasionally even inductors. These can either be controlled in an analog manner (e.g., Varicap) or a digital manner. As true analog varicaps and analog potentiometers can't be made inside a chip, they are mimicked by a network of capacitors and resistors, which can be switched on or off within the network by means of a transistor. Switching these transistors needs to be established one or more times during calibration of the circuit, and they need to stay in the same position during the normal operation of the circuit. Even more, the circuit needs to memorize the position of these switches also when no power is supplied to the circuit. Hence, it requires some non-volatile memory to retain the position of these switches.

Today, the non-volatile elements can be either one time programmable or multiple times programmable. In the case of a one-time programmable solution, there are traditionally the following options. First, a 'laser fuse', which is a small wire placed on the chip, which will be melted away by means of exposure to a small laser bundle. Second, an 'anti-fuse', which is a high impedance via-connection between two wires on the chip which can be blown-up to become a low impedance connection. Third, an 'electrical fuse', which is a special wire on the chip, which can be electrically blown-up to become a high impedance. Fourth, blowing-up a transistor, which becomes a high impedance value versus a low impedance, when normally switched on. One of the issues with one-time programmable devices is that they can't be tested in both states prior to releasing it to a customer.

Some analog and mixed signal devices are programmed only once but still will use a multi-times programmable element in order to apply a decent test prior to active usage. Other analog and mixed signal devices simply are programmed more than once and therefore prefer to use a multiple time programmable element. Examples of technologies for multiple programmable elements include at least four different technologies. First among the examples is floating gate techniques. The floating gates are transistors with an extra floating gate, which can get charged by applying different high voltages. A charged floating gate will provide another behavior of such a transistor, which can be detect as a difference in current at the same gate voltage. There are different variations of this technology like: EPROM, EEPROM, flash, NOR flash, NAND flash, SONOS etc. Second among the examples is a ferro-electric technique where a ferro-electric material is used as the dielectric of a capacitor resulting in two different values for this capacitor, depending on the bias of the voltage. Third among the examples is a magnetic-resistive technique of which two different versions exist. Fourth among the examples is phase change techniques.

Another area where MEMS devices would be beneficial is field-programmable gate arrays (FPGAs). A FPGA is a semiconductor device that can be configured by the customer or designer after manufacturing—hence the name "field-programmable". FPGAs are programmed using a logic circuit diagram or a source code in a hardware description language (HDL) to specify how the chip will work. They can be used to implement any logical function that an application-specific integrated circuit (ASIC) could perform, but the ability to update the functionality after shipping offers advantages for many applications.

FPGAs contain programmable logic components called "logic blocks", and a hierarchy of reconfigurable interconnects that allow the blocks to be "wired together"—somewhat like a one-chip programmable breadboard. Logic blocks can be configured to perform complex combinational functions, or merely simple logic gates like AND and XOR. In most FPGAs, the logic blocks also include memory elements, which may be simple flip-flops or more complete blocks of memory.

It would be beneficial to be able to fabricate FPGAs, NAND, nvSRAM, AMS chips and memory logic devices utilizing less chip space without affecting front end of the line (FEOL) processes.

SUMMARY OF THE INVENTION

Embodiments disclosed herein generally relate to switches that utilize micro-electromechanical systems (MEMS). By replacing transistors in many devices with switches such as MEMS switches, the devices may be used for logic applications. MEMS switches may be used in devices such as FPGAs, NAND devices, nvSRAM devices, AMS chips and general memory logic devices. The benefit of utilizing MEMS devices in place of transistors is that the transistors utilize more space on the chip. Additionally, the MEMS devices can be formed in the BEOL without having any negative impacts on the FEOL or necessitating the use of additional layers within the chip.

In one embodiment, a device is disclosed in which a MEMS switch is utilized in place of a digital transistor. Within CMOS, both the PMOS and CMOS transistors can be replaced by MEMS switches. The cap of the MEMS switch can be the bulk of the transistor. When both the PMOS and CMOS transistors are replaced by MEMS switches, it is considered to be an inverter. In another embodiment, an inverter is disclosed. The inverter includes a first micro electromechanical device having a first contact electrode, a first pull-in electrode and a first cantilever electrode movable from a position in contact with the first contact electrode and a position spaced from the first contact electrode. The inverter also includes a second micro electromechanical device having a second contact electrode, a second pull-in electrode and a second cantilever electrode movable from a position in contact with the second contact electrode and a position spaced from the second contact electrode. The inverter also includes a Vss line coupled to the first cantilever electrode, a Vdd line coupled with the second cantilever electrode, an input line coupled with the first pull-in electrode and the second pull-in electrode, and an output line coupled with the first contact electrode and the second contact electrode.

In another embodiment, an inverter is disclosed. The inverter includes a first micro electromechanical device having a first contact electrode, a first pull-in electrode and a first cantilever electrode movable from a position in contact with the first contact electrode and a position spaced from the first contact electrode. The inverter also includes a second micro electromechanical device having a second contact electrode, a second pull-in electrode and a second cantilever electrode movable from a position in contact with the second contact electrode and a position spaced from the second contact electrode. The inverter also includes a Vss line coupled to the first cantilever electrode, a Vdd line coupled with the second cantilever electrode, a first input line coupled with the first pull-in electrode, a second input line coupled with the second pull-in electrode, and an output line coupled with the first contact electrode and the second contact electrode. The inverter may be used to create a NAND gate or any other complex digital gate.

MEMS devices may also be used for NAND gates. The NAND gate is a digital logic gate. A low output results only if both the inputs to the gate are high. If one or both inputs are low, a high output results. The NAND gate is a universal gate in the sense that any Boolean function can be implemented by NAND gates.

Digital systems employing certain logic circuits take advantage of NAND's functional completeness. NAND gates can also be made with more than two inputs, yielding an output of low if all of the inputs are high, and an output of high if any of the inputs is low. These kinds of gates therefore operate as n-array operators instead of a simple binary operator. Algebraically, these can be expressed as the function NAND (a, b, . . . , n), which is logically equivalent to NOT (a AND b AND . . . AND n). The NAND gate is the easiest gate to manufacture, and also has the property of functional completeness. That is, any other logic function (AND, OR, etc.) can be implemented using only NAND gates. An entire processor can be created using NAND gates alone. Typically, technicians do not make digital designs with only NAND gates. Rather, much more complex gates are utilized.

In another embodiment, a cold-switch having a precharged logic or non-overlapping clocking scheme is disclosed. The cold-switch includes a first micro electromechanical device having a first contact electrode, a first pull-in electrode and a first cantilever electrode movable from a position in contact with the first contact electrode and a position spaced from the first contact electrode. The cold-switch also includes a second micro electromechanical device having a second contact electrode, a second pull-in electrode and a second cantilever electrode movable from a position in contact with the second contact electrode and a position spaced from the second contact electrode. The cold-switch also includes a third micro electromechanical device having a third contact electrode in contact with the first contact electrode, a third pull-in electrode and a third cantilever electrode coupled with the second contact electrode and movable between a position in contact with the third contact electrode and a position spaced from the third contact electrode. The precharged logic may be used to create a NAND gate or any other complex digital gate.

In another embodiment, a non-volatile memory device is disclosed. The memory device includes a non-volatile micro electromechanical device having a pull-up electrode, a cantilever electrode, a pull-down electrode and a contact electrode. The memory device also includes a transistor having a source electrode, a drain electrode coupled to the contact electrode, and a gate electrode. The memory device also includes a bit line coupled to the source electrode, a VSS line coupled to the pull-up electrode, and a data line coupled to the cantilever electrode.

In another embodiment, a memory device is disclosed. The memory device includes a first micro electromechanical device having a first cantilever electrode, a first pull-in electrode and a first contact electrode. The memory device also includes a second micro electromechanical device having a second cantilever electrode, a second pull-in electrode coupled to the first pull-in electrode, and a second contact electrode. The memory device also includes a third micro electromechanical device having a third cantilever electrode coupled to the second contact electrode, a third pull-in electrode and a third contact electrode. The memory device also includes a fourth micro electromechanical device having a fourth cantilever electrode coupled to the second contact electrode, a fourth pull-in electrode and a fourth contact electrode. The memory device also includes a fifth micro electromechanical device having a fifth cantilever electrode, a fifth pull-in electrode coupled to the third contact electrode and a fifth contact electrode coupled to the third contact electrode. The memory device also includes a sixth micro electromechanical device having a sixth cantilever electrode, a sixth pull-in electrode coupled to the fifth pull-in electrode and a sixth contact electrode coupled to the fourth contact electrode. The memory device also includes a Vss line coupled to the first cantilever electrode and the second cantilever electrode and a Vdd line coupled to the fifth cantilever electrode and the sixth cantilever electrode.

In another embodiment, a nvSRAM device is disclosed. The nvSRAM includes at least one micro electromechanical device having four terminals, at least one transistor, a plurality of bit lines, a VddRow line, a word line, a store line, a restore line and a Vss line.

In another embodiment, a nvSRAM device is disclosed. The nvSRAM device includes at least one volatile micro electromechanical device having four terminals, at least one non-volatile micro electromechanical device having four terminals, at least one transistor, a plurality of bit lines, a VddRow line, a word line, a store line, a restore line and a Vss line.

In another embodiment, a nvSRAM device is disclosed. The nvSRAM device includes a plurality of micro electromechanical devices having four terminals, a plurality of transistors, a plurality of bit lines, a VddRow line, a word line, a store line, a release line and a Vssr line.

In another embodiment, a nvSRAM device is disclosed. The nvSRAM device includes at least one micro electromechanical device having a first contact electrode, a second contact electrode, a first pull-in electrode, a second pull-in electrode. The nvSRAM device also includes a rocker electrode movable between a position in contact with the first contact electrode to a position spaced from both the first contact electrode and the second contact electrode to a position in contact with the second contact electrode. The nvSRAM device also includes at least one transistor, a plurality of bit lines, a VddRow line, a word line, a store line, a restore line and a Vss line.

In another embodiment, a nvSRAM device is disclosed. The nvSRAM device includes at least one micro electromechanical device having a first contact electrode, a second contact electrode, a first pull-in electrode, a second pull-in electrode. The nvSRAM device also includes a rocker electrode movable between a position in contact with the first contact electrode to a position spaced from both the first contact electrode and the second contact electrode to a position in contact with the second contact electrode. The nvSRAM device also includes thirteen transistors, a plurality of bit lines, a VddRow line, a word line, a store line, a restore line and a Vss line.

In another embodiment, a nvSRAM device is disclosed. The nvSRAM device includes at least one micro electromechanical device having a first contact electrode, a second contact electrode, a first pull-in electrode, a second pull-in electrode. The nvSRAM device also includes a rocker electrode movable between a position in contact with the first contact electrode to a position spaced from both the first contact electrode and the second contact electrode to a position in contact with the second contact electrode. The nvSRAM device also includes twelve transistors, a plurality of bit lines, a VddRow line, a word line, a store line, a restore line and a Vss line.

In another embodiment, a NAND-based non-volatile memory architecture is disclosed. The NAND-based non-volatile memory architecture includes a first micro electromechanical device having a first pull-up electrode, a first pull-in electrode, a first contact electrode and a first cantilever electrode movable between a position in contact with the first contact electrode and a position spaced from the first contact electrode. The NAND-based non-volatile memory architecture also includes a second micro electromechanical device having a second pull-up electrode, a second pull-in electrode, a second contact electrode and a second cantilever electrode movable between a position in contact with the second contact electrode and a position spaced from the second contact electrode. The second cantilever electrode is coupled to the first contact electrode. The NAND-based non-volatile memory architecture also includes a first word line coupled to the first pull-in electrode, a second word line coupled to the second pull-in electrode, a Vss line coupled to the first cantilever electrode and a transistor coupled to the second micro electromechanical device.

In another embodiment, a method of reading a NAND-based non-volatile memory architecture is disclosed. The NAND-based non-volatile memory architecture has a first micro electromechanical device having a first pull-up electrode, a first pull-in electrode, a first contact electrode and a first cantilever electrode movable between a position in contact with the first contact electrode and a position spaced from the first contact electrode. The NAND-based non-volatile memory architecture also has a second micro electromechanical device having a second pull-up electrode, a second pull-in electrode, a second contact electrode and a second cantilever electrode movable between a position in contact with the second contact electrode and a position spaced from the second contact electrode. The second cantilever electrode is coupled to the first contact electrode. The NAND-based non-volatile memory architecture also includes a first word line coupled to the first pull-in electrode, a second word line coupled to the second pull-in electrode, a Vss line coupled to the first cantilever electrode, a transistor having a drain electrode coupled to the second contact electrode, a gate electrode coupled to a bit signal line, a source electrode coupled to a bit line, and a data line coupled to the first pull-up electrode and the second pull-up electrode. The method includes applying a first voltage to the first word line, applying a second voltage to the second word line that is less than the first voltage, applying a third voltage to the bit select line that is substantially equal to the first voltage, applying a fourth voltage to the bit line that is less than the third voltage and greater than the second voltage, moving the first cantilever electrode to a position in contact with the first contact electrode, and moving the second cantilever electrode to a position in contact with the second contact electrode.

In another embodiment, a method of programming a NAND-based non-volatile memory architecture is disclosed. The NAND-based non-volatile memory architecture has a first micro electromechanical device having a first pull-up electrode, a first pull-in electrode, a first contact electrode and a first cantilever electrode movable between a position in contact with the first contact electrode and a position spaced from the first contact electrode. The NAND-based non-volatile memory architecture also has a second micro electromechanical device having a second pull-up electrode, a second pull-in electrode, a second contact electrode and a second cantilever electrode movable between a position in contact with the second contact electrode and a position spaced from the second contact electrode. The second cantilever electrode is coupled to the first contact electrode. The NAND-based non-volatile memory architecture also includes a first word line coupled to the first pull-in electrode, a second word line coupled to the second pull-in electrode, a Vss line coupled to the first cantilever electrode, a transistor having a drain electrode coupled to the second contact electrode, a gate electrode coupled to a bit signal line, and a source electrode coupled to a bit line and a data line coupled to the first pull-up electrode and the second pull-up electrode. The method includes applying a first voltage to the first word line, applying a second voltage to the second word line that is substantially equal to the first voltage, applying a third voltage to the bit select line that is less than the first voltage, applying a fourth voltage to the bit line that is less than the third voltage, moving the first cantilever electrode to a position in contact with the first contact electrode and moving the second cantilever electrode to a position in contact with the second contact electrode.

In another embodiment, a method of erasing a NAND-based non-volatile memory architecture is disclosed. The NAND-based non-volatile memory architecture includes a first micro electromechanical device having a first pull-up electrode, a first pull-in electrode, a first contact electrode and a first cantilever electrode movable between a position in contact with the first contact electrode and a position spaced from the first contact electrode. The NAND-based non-volatile memory architecture also includes a second micro electromechanical device having a second pull-up electrode, a second pull-in electrode, a second contact electrode and a second cantilever electrode movable between a position in contact with the second contact electrode and a position spaced from the second contact electrode. The second cantilever electrode is coupled to the first contact electrode. A first word line is coupled to the first pull-in electrode. The NAND-based non-volatile memory architecture also includes a second word line coupled to the second pull-in electrode, a Vss line coupled to the first cantilever electrode, a transistor having a drain electrode coupled to the second contact electrode, a gate electrode coupled to a bit signal line, a source electrode coupled to a bit line and a data line coupled to the first pull-up electrode and the second pull-up electrode. The method includes applying a first voltage to the first word line, applying a second voltage to the second word line that is less than the first voltage, applying a third voltage to the bit select line that is substantially equal to the first voltage, applying a fourth voltage to the bit line that is less than the third voltage and greater than the second voltage, applying a fifth voltage to the data line that is greater than the first voltage, moving the first cantilever electrode to a position spaced from the first contact electrode and moving the second cantilever electrode to a position spaced from the second contact electrode.

In another embodiment, a non-volatile NAND array is disclosed. The array includes a first word line, a second word line, a third word line, a first bit select line, a first bit line, a second bit line, a third bit line, a first data line, a second date line and a third data line. The array also includes a first micro electromechanical device having a first pull-in electrode coupled to the first word line, a first contact electrode, a first pull-up electrode and a first cantilever electrode. The array also includes a second micro electromechanical device having a second pull-in electrode coupled to the second word line, a second contact electrode coupled with the first cantilever electrode, a second cantilever electrode and a second pull-up electrode. The array also includes a third micro electromechanical device having a third pull-in electrode coupled to the third word line, a third contact electrode coupled to the second cantilever electrode, a third cantilever electrode and a third pull-up electrode. The array also includes a Vss line coupled to the third cantilever electrode, a first transistor having a first source electrode coupled to the first bit line, a first drain electrode coupled to the first contact electrode, a first gate electrode coupled to the first bit select line, a second transistor having a second source electrode coupled to the first data line, a second drain electrode coupled to each of the first pull-up electrode, the second pull-up electrode and the third pull-up electrode, and a second gate electrode coupled to the first bit select line.

In another embodiment, a mFPLA is disclosed. The mFPLA includes a first bit line, a first block select line, a first erase column line, a first erase row line, a first data line and a first data select line. The mFPLA also includes a first transistor having a first source electrode coupled to the bit line, a first drain electrode and a first gate electrode coupled to the block select line. The mFPLA also includes a second transistor having a second source electrode coupled to the erase column line, a second drain electrode and a second gate electrode coupled to the block select line. A third transistor having a third source electrode coupled to the data line, a third drain electrode and a third gate electrode coupled to the data select line may also be present. The mFPLA also includes a fourth transistor having a fourth source electrode coupled to the erase row line, a fourth drain electrode and a fourth gate electrode coupled to the data select line. The mFPLA also includes a first micro electromechanical device having a first contact electrode coupled to both the first drain electrode and the third drain electrode, a first pull-in electrode, a first pull-up electrode coupled to the second drain electrode and a first cantilever electrode movable between a position in contact with the first contact electrode and a position spaced form the first contact electrode. A second micro electromechanical device having a second contact electrode, a second pull-in electrode coupled to the first drain electrode and the third drain electrode, a third contact electrode lying in substantially the same plane as the second contact electrode coupled to the fourth drain electrode, and a first rocker electrode movable between positions in contact with the second contact electrode, in contact with the third contact electrode, and spaced from both the second contact electrode and the third contact electrode may also be present.

In another embodiment, a mFPLA is disclosed. The mFPLA includes a first bit line, a first erase column line, a block select line, a first data line, a first erase data line and a data select line. The mFPLA also includes a first transistor having a first source electrode coupled to the first bit line, a first drain electrode and a first gate electrode coupled to the block select line. A second transistor having a second source electrode coupled to the first erase column line, a second drain electrode and a second gate electrode coupled to the block select line may also be present. The mFPLA also includes a third transistor having a third source electrode coupled to the first data line, a third drain electrode and a third gate electrode coupled to the data select line. A fourth transistor having a fourth source electrode coupled to the first erase data line, a fourth drain electrode and a fourth gate electrode coupled to the data select line may also be present. The mFPLA also includes a first micro electromechanical element having a first contact electrode coupled to the first drain electrode, a first pull-in electrode, a first pull-up electrode coupled to the second drain electrode and a first cantilever electrode movable between a position in contact with the first contact electrode and a position spaced from the first contact electrode. A second micro electromechanical element having a second contact electrode coupled to the first cantilever electrode, a second pull-in electrode, a second pull-up electrode coupled to the second drain electrode and a second cantilever electrode movable between a position in contact with the second contact electrode and a position spaced from the second contact electrode may also be present. The mFPLA also includes a third micro electromechanical element having a third contact electrode coupled the third drain electrode, a third pull-in electrode, a third pull-up electrode coupled to the fourth drain electrode and a third cantilever electrode coupled to the first contact electrode and the first drain electrode and movable between a position in contact with the third contact electrode and a position spaced from the third contact electrode.

In another embodiment, a mFPLA is disclosed. The mFPLA includes a first bit line, a first erase column line, a first erase row line, a first data line, a block select line and a data select line. The mFPLA also includes a first transistor having a first source electrode coupled to the first bit line, a first drain electrode and a first gate electrode coupled to the block select line. A second transistor having a second source electrode coupled to the erase column line, a second drain electrode and a second gate electrode coupled to the block select line may also be present. The mFPLA also includes a third transistor having a third source electrode coupled to the first data line, a third drain electrode and a third gate electrode coupled to the data select line. A fourth transistor having fourth source electrode coupled to the first erase row line, a fourth drain electrode and a fourth gate electrode coupled to the data select line may also be present. The mFPLA also includes a first micro electromechanical element having a first contact electrode, a second contact electrode coupled to the second drain electrode and disposed in substantially the same plane as the first contact electrode, a first pull-in electrode coupled to the third drain electrode and the first drain electrode, and a first rocker electrode movable between a position in contact with the first contact electrode, a position in contact with the second contact electrode and a position spaced from both the first contact electrode and the second contact electrode. A second micro electromechanical element having a third contact electrode, a fourth contact electrode coupled to the fourth drain electrode and disposed in substantially the same plane as the third contact electrode, a second pull-in electrode coupled to the third drain electrode, first pull-in electrode and first drain electrode, and a second rocker electrode movable between a position in contact with the third contact electrode, a position in contact with the fourth contact electrode and a position spaced from both the third contact electrode and the fourth contact electrode may also be present.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to switches that utilize micro-electromechanical systems (MEMS). By replacing transistors in many devices with switches such as MEMS switches, the devices may be used for logic applications. MEMS switches may be used in devices such as FPGAs, NAND devices, nvSRAM devices, AMS chips and general memory logic devices. The benefit of utilizing MEMS devices in place of transistors is that the transistors utilize more space on the chip. Additionally, the MEMS devices can be formed in the BEOL without having any negative impacts on the FEOL or necessitating the use of additional layers within the chip.

Figure 1:
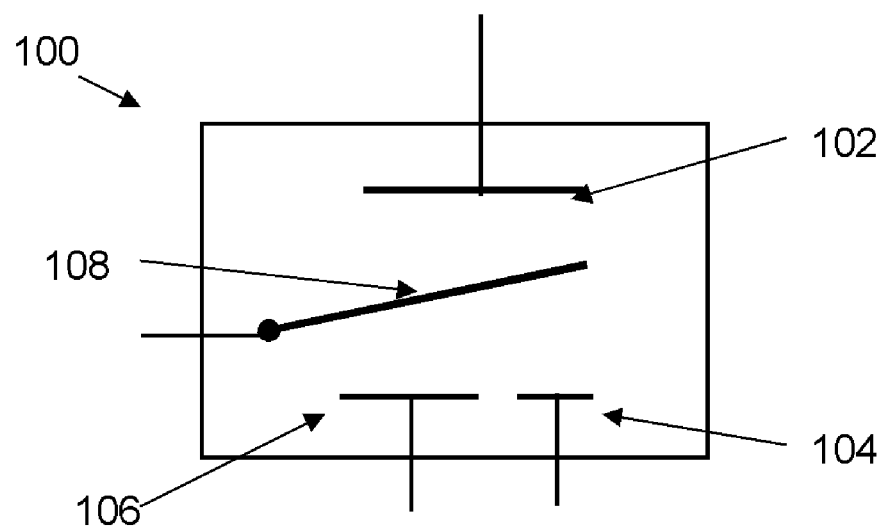
FIG. 1 is a schematic illustration of a cantilever-type MEMS device 100.

Throughout the description herein, reference will be made to a cantilever-type MEMS device and a rocker-type MEMS device. FIG. 1 shows a cantilever-type MEMS device 100. The cantilever-type MEMS device 100 includes a pull-up electrode 102, a contact electrode 104, a pull-in electrode 106 and a cantilever electrode 108. During operation, the cantilever electrode 108 is movable from a position spaced from the contact electrode 104 to a position in contact with the contact electrode 104. In one embodiment, the cantilever electrode 108 may even move to a position in contact with the pull-up electrode. In some situations, the pull-up electrode may be referred to as a pull-off electrode, but it is to be understood that the terms pull-up electrode and pull-off electrode are interchangeable. Additionally, in some situations, the term pull-down electrode may be used to refer to a pull-in electrode. It is to be understood that the terms pull-in electrode and pull-down electrode may be interchangeable. Additionally, the orientation of the MEMS device 100 is not limited to the orientation shown in FIG. 1. In certain embodiments, the pull-up electrode 102 may not be present. In other embodiments, the pull-in electrode 106 may not be present.

Figure 2:
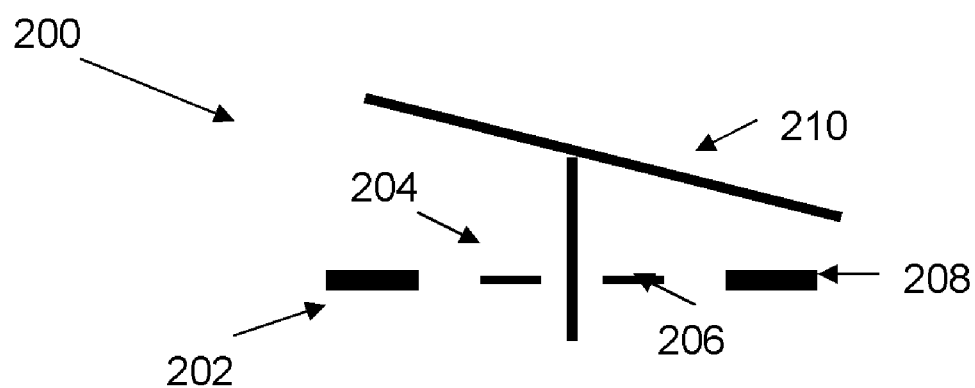
FIG. 2 is a schematic illustration of a rocker-type MEMS device 200.

FIG. 2 is a schematic illustration of a rocker-type MEMS device 200. The rocker-type MEMS device may include a first contact electrode 202, a first pull-in electrode 204, a second pull-in electrode 206, a second contact electrode 208 and a rocker electrode 210. The first contact electrode 202 and the second contact electrode 208 may be disposed in substantially the same plane. In one embodiment, only one pull-in electrode 204, 206 is utilized. The rocker electrode 210 is movable between a position in contact with the first contact electrode 202, a position in contact with the second contact electrode 208 and a position spaced from both the first contact electrode 202 and the second contact electrode 208.

Advantages of the new MEMS device/design families include providing an effective, cost reduced design practice. For example, the multiple-die EEPROM and CMOS can be combined into one device. A small and simple FPGA can be implemented with MEMS-based interconnect layer design. Multiple chip designs can be implemented on the same die where CMOS contains the main function, and interconnect layer contains the necessary logic and NVM for the secondary design. The design can be another foundation of a 3D FPGA.

Figure 3:
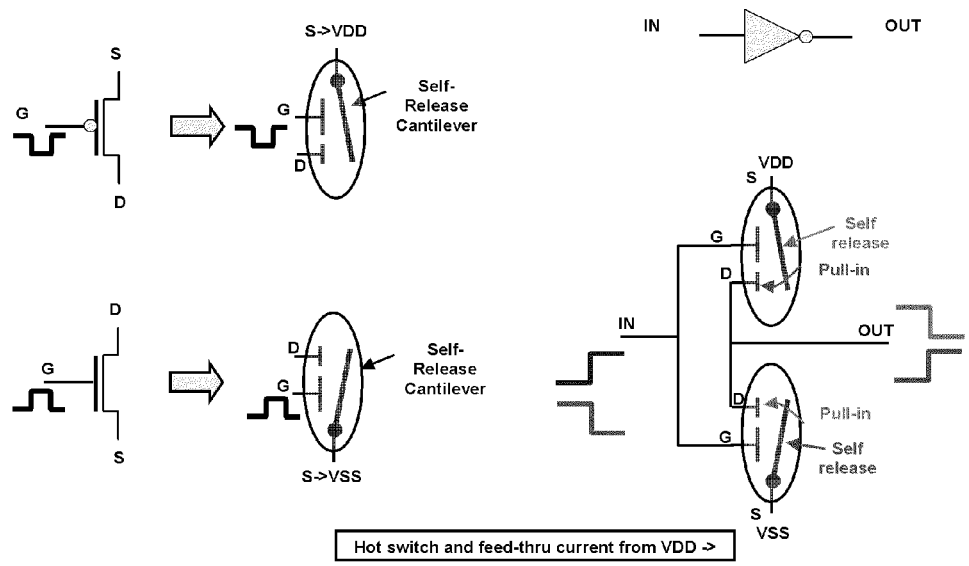
FIG. 3 shows a schematic illustration of an inverter according to one embodiment.

In the logic family, self-released cantilevers are used. In inverter design, hot switch and feed through current are used and shown in FIG. 3. There will be hot switch feed through current from VDD to VSS because two cantilevers will not switch at the exact the same time. FIG. 3 shows an inverter having first and second micro electromechanical devices that each have a contact electrode, a pull-in electrode and a cantilever electrode movable from a position in contact with the contact electrode and a position spaced from the contact electrode. The inverter also includes a Vss line coupled to one of the cantilever electrodes and a Vdd line coupled with the other cantilever electrode. An input line is coupled with the pull-in electrodes and an output line is coupled with the contact electrodes.

Figure 4:
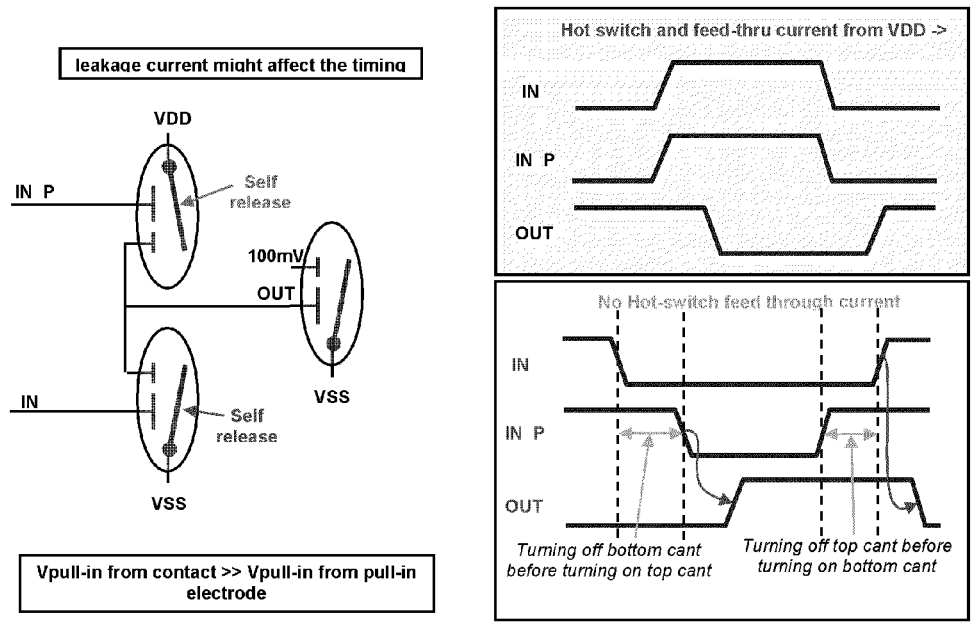
FIG. 4 shows a schematic illustration of an inverter according to another embodiment.
Figure 5:
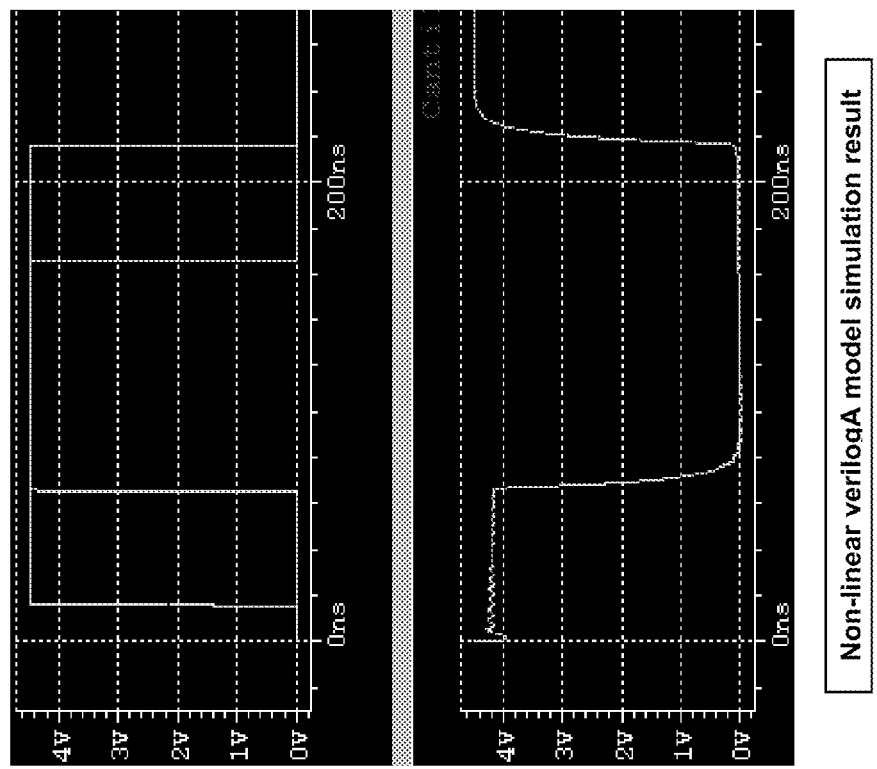
FIG. 5 shows a schematic illustration of an inverter according to another embodiment.
Figure 5:
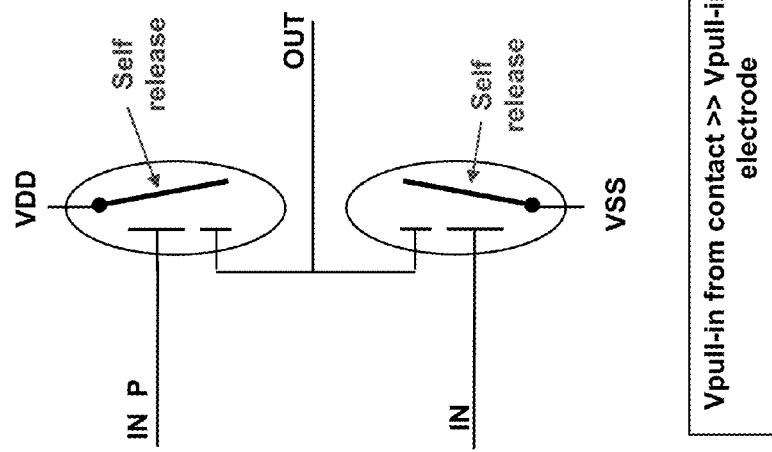

To avoid the hot-switch feed through current, a different version of inverter was designed as shown in FIGS. 4 and 5 that shows a no-hot-switch feed-through current logic design. The inverter shown in FIGS. 4 and 5 includes two micro electromechanical devices that each have a contact electrode, a pull-in electrode and a cantilever electrode movable from a position in contact with the contact electrode and a position spaced from the contact electrode. A Vss line is coupled to one of the cantilever electrodes while a Vdd line is coupled with the other cantilever electrode.

Figure 6:
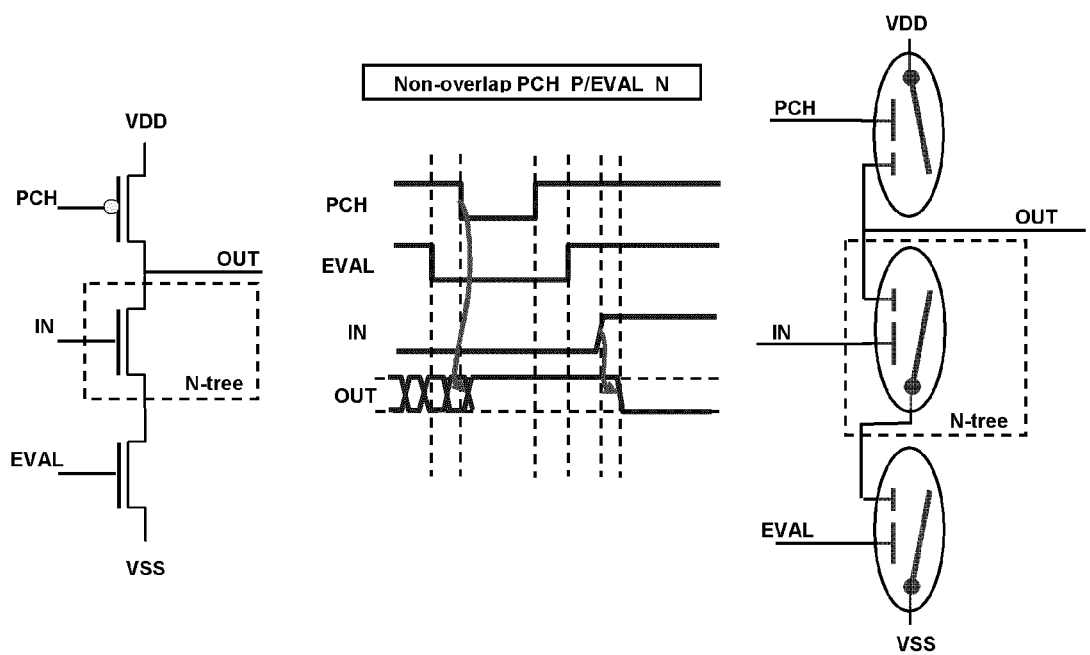
FIGS. 6 and 7 show cold switch logic using a non-overlapping clocking scheme.
Figure 7:
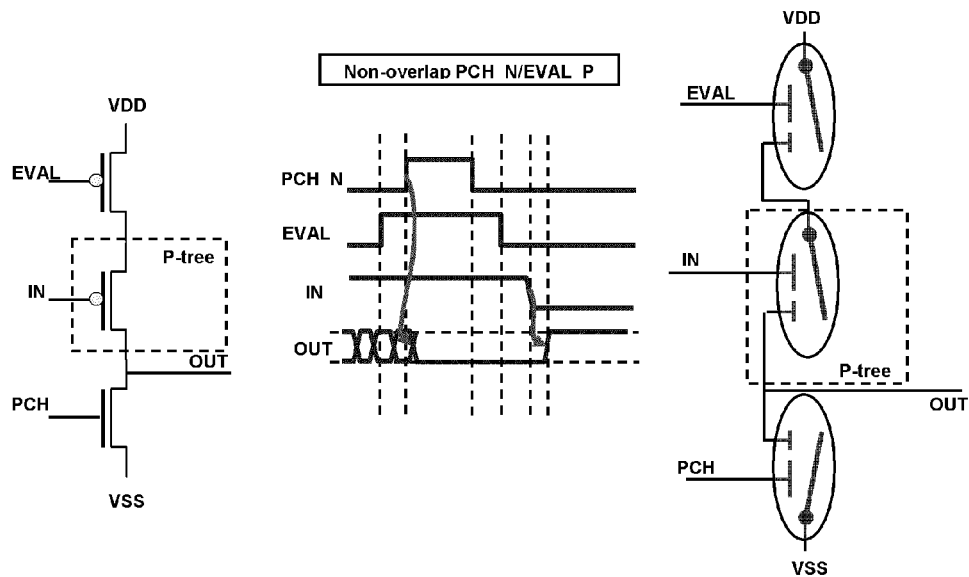
Figure 8:
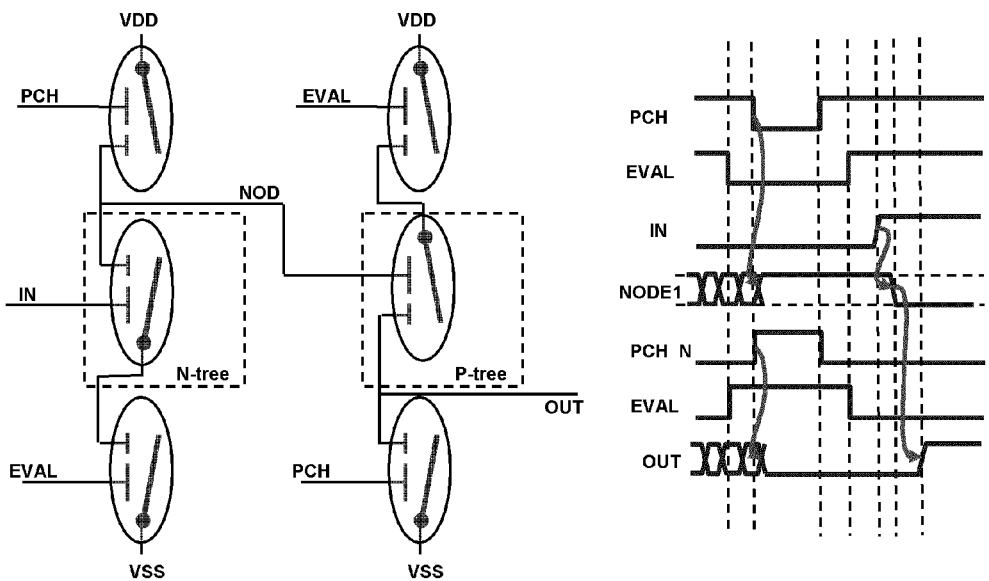
FIG. 8 shows a cold switch formed by combining the cold switch logic of FIGS. 6 and 7.

Similarly, a family of cold-switch logic using precharged logic was developed as shown in FIGS. 6 and 7. After FIGS. 6 and 7 are combined, the logic will be as the following as shown in FIG. 8. The cold-switch of FIG. 8 has a non-overlapping clocking scheme and includes multiple micro electromechanical devices. The micro electromechanical devices have a contact electrode, a pull-in electrode and a cantilever electrode movable from a position in contact with the contact electrode and a position spaced from the contact electrode. An input may be coupled with one or the pull-in electrodes while an output may be coupled with one of the contact electrodes.

Figure 9:
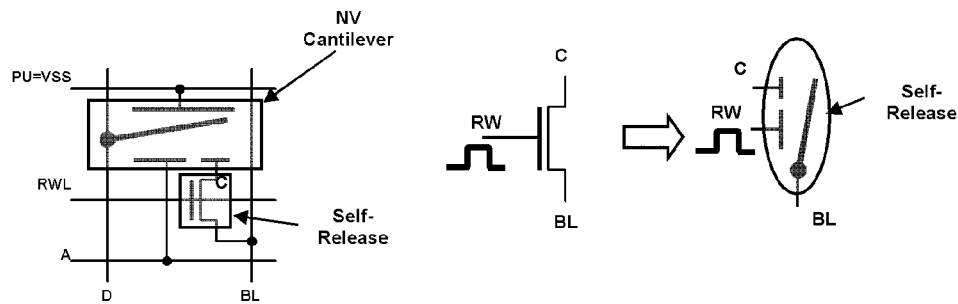
FIG. 9 shows a NVM memory cell using a self-released cantilever for a pass gate and using a non-volatile cantilever for a NVM device.

In one embodiment, NVMs utilizing only MEMS devices are discussed. A NVM memory cell using a self-released cantilever for a pass gate and using a non-volatile cantilever for a NVM device is shown in FIG. 9. The pull up electrode may be low at PR"1" and PR"0". The cantilever may be low at PR"1" and high at PR"0". The pull in electrode may be high at PR"1" and at PR"0". The MEMS device could be erased by applying a resonant frequency on the pull-up or pull-in electrode. Non-volatile and self release cantilevers on the same MEMS process may also be considered. A non-volatile cantilever utilizes 'thinning' of the leg portion of the cantilever to control the resiliency of the cantilever. A self-release cantilever, on the other hand, does not usually have 'thinning' of the leg so that the cantilever is resilient enough to pop off the contact electrode when the voltage is reduced to 0. Other options to consider for the cantilever include different shapes for the non-volatile memory, different shapes for the self release cantilever, no leg, and being in the same cavity.

Figure 10:
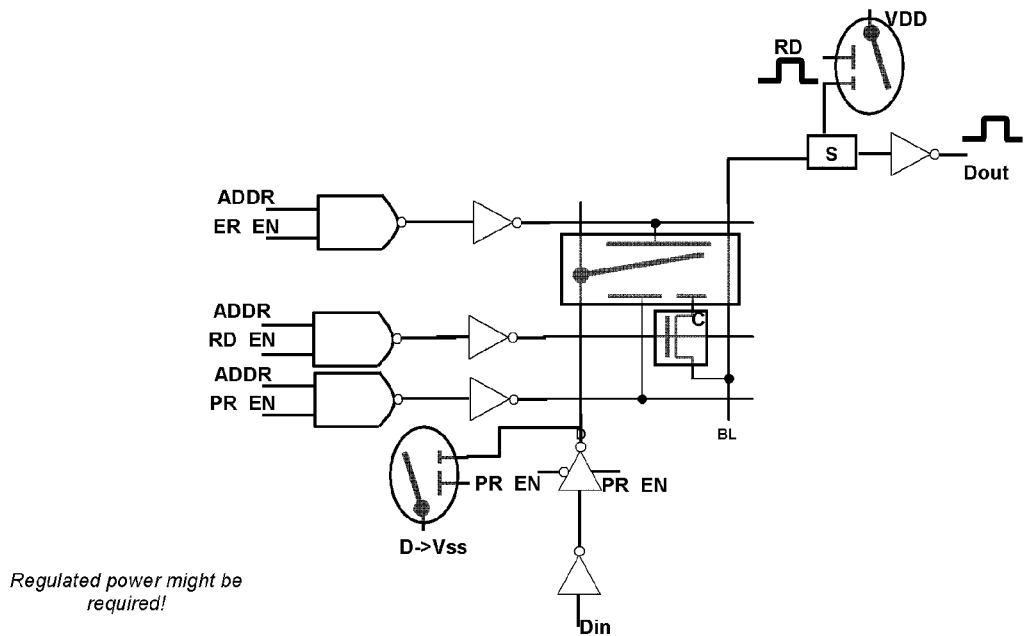
FIG. 10 shows a MEMS-only memory cell.

Another possibility for MEMS-based logic is in memory arrays. Using MEMS based logic and MEMS-only memory cell is shown in FIG. 10. The memory cell includes a non-volatile micro electromechanical device having a pull-up electrode, a cantilever electrode, a pull-down electrode and a contact electrode. The memory device also includes a transistor having a source electrode, a drain electrode coupled to the contact electrode, and a gate electrode. The memory device also includes a bit line coupled to the source electrode, a VSS line coupled to the pull-up electrode and a data line coupled to the cantilever electrode.

Figure 11:
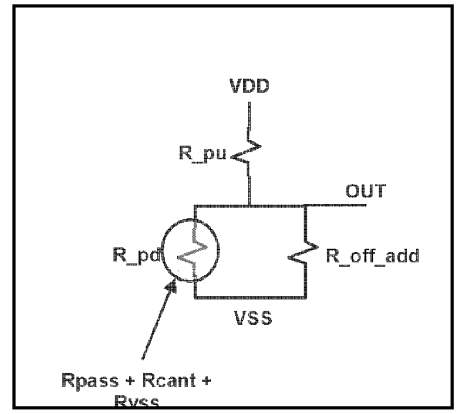
FIG. 11 shows a digital MEMS-based SA concept.
Figure 12:
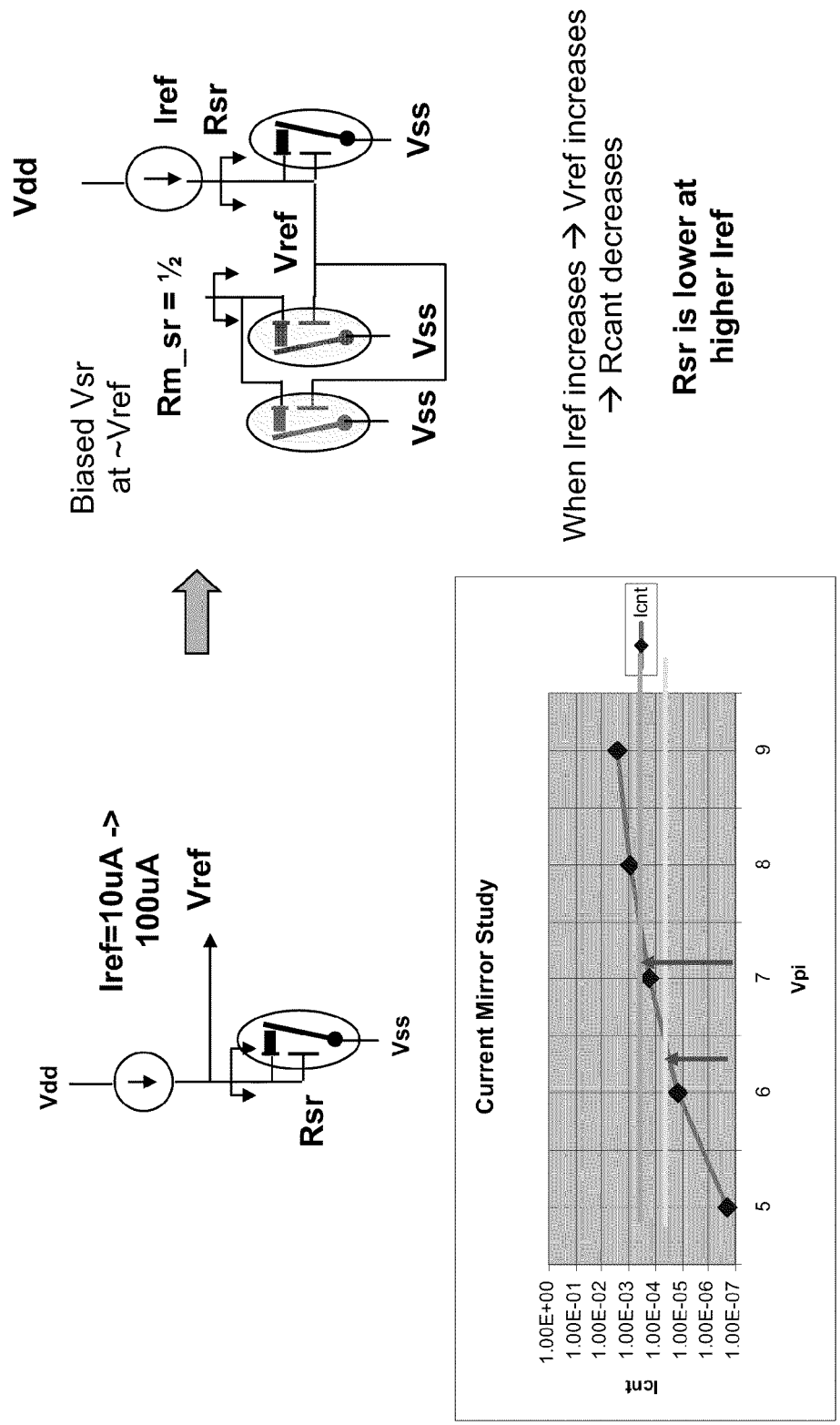
FIG. 12 shows a resistance mirror.
Figure 13:
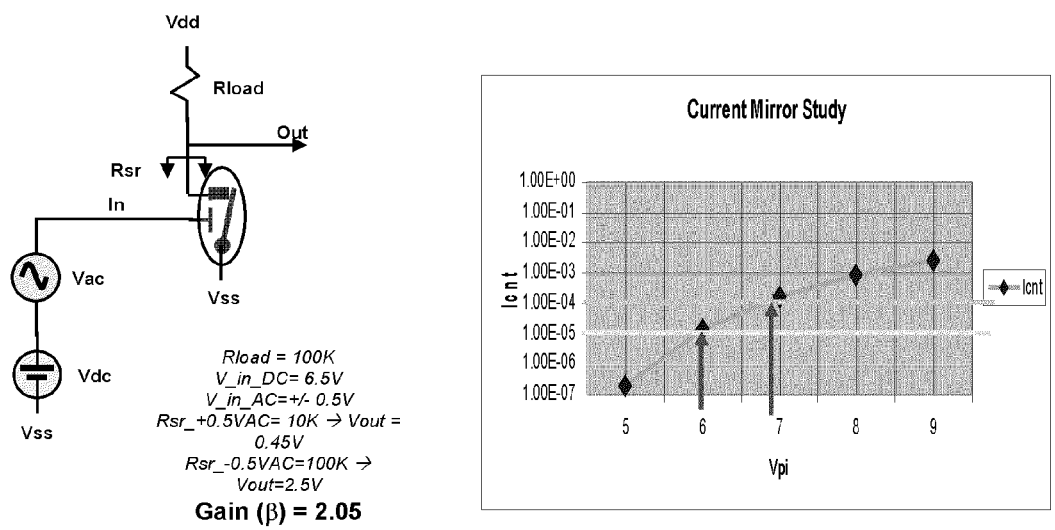
FIG. 13 shows a single ended SA.
Figure 14:
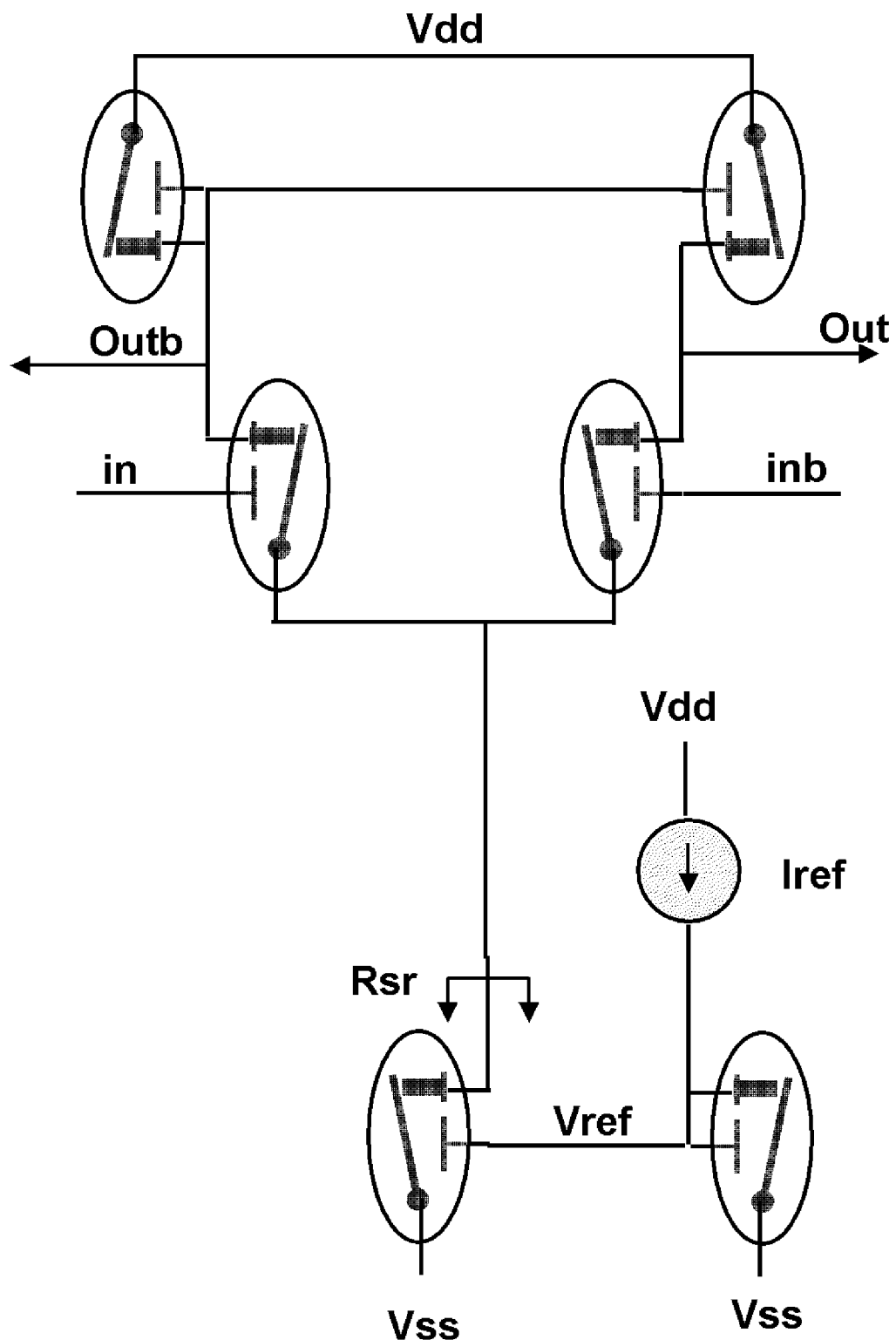
FIG. 14 shows a differential SA with resistance mirror circuit.

There are various other possibilities for devices utilizing MEMS devices that will be discussed with reference to FIGS. 11-23. A digital MEMS-based SA concept is shown in FIG. 11. In the analog family, an always-on cantilever, a self-released cantilever, MEMS based cap and a resistor may be used. A resistance mirror, (e.g., this circuit is equivalent to current mirror in CMOS design) is shown in FIG. 12. A single ended SA is shown in FIG. 13. A differential SA with resistance mirror circuit is shown in FIG. 14. The differential SA includes multiple micro electromechanical devices that each have a cantilever electrode, a pull-in electrode and a contact electrode. The differential SA also includes a Vss line coupled to multiple cantilever electrodes and a Vdd line coupled to multiple cantilever electrodes.

Figure 15:
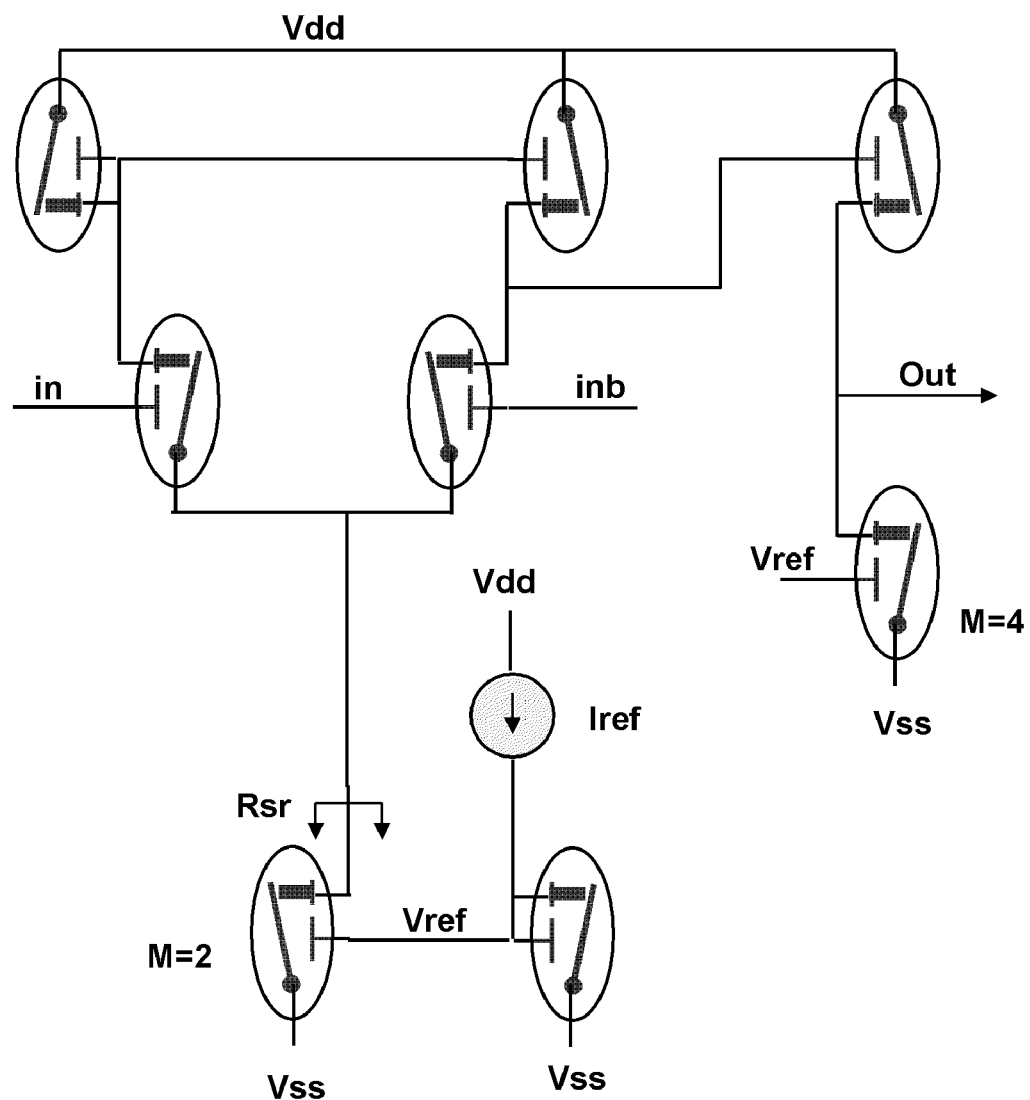
FIG. 15 shows a 2-stage Op Amp with resistance mirror circuit.
Figure 16:
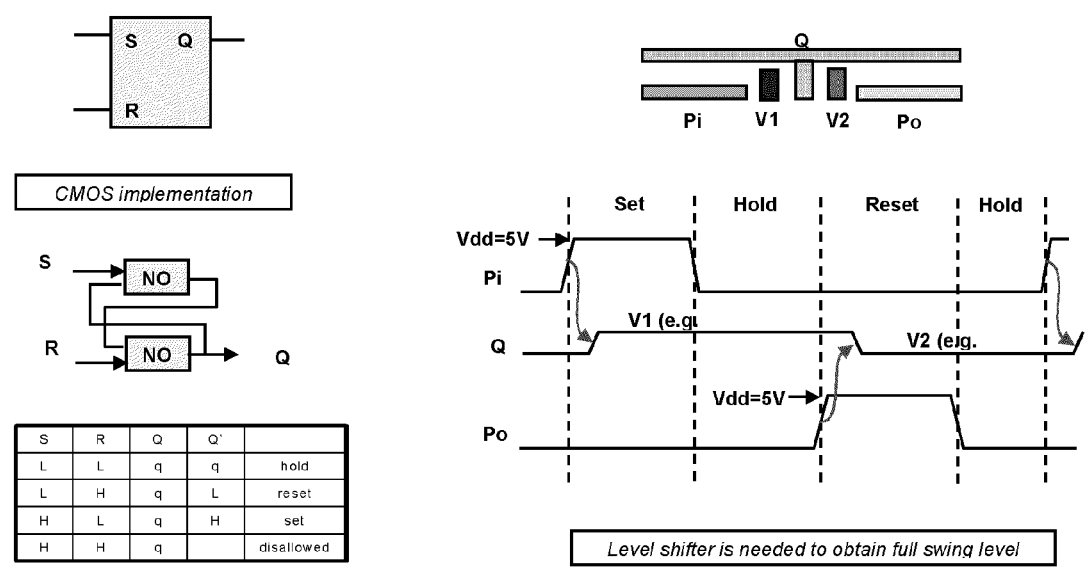
FIG. 16 shows a non-volatile, asynchronous RS latch using rocker device.
Figure 17:
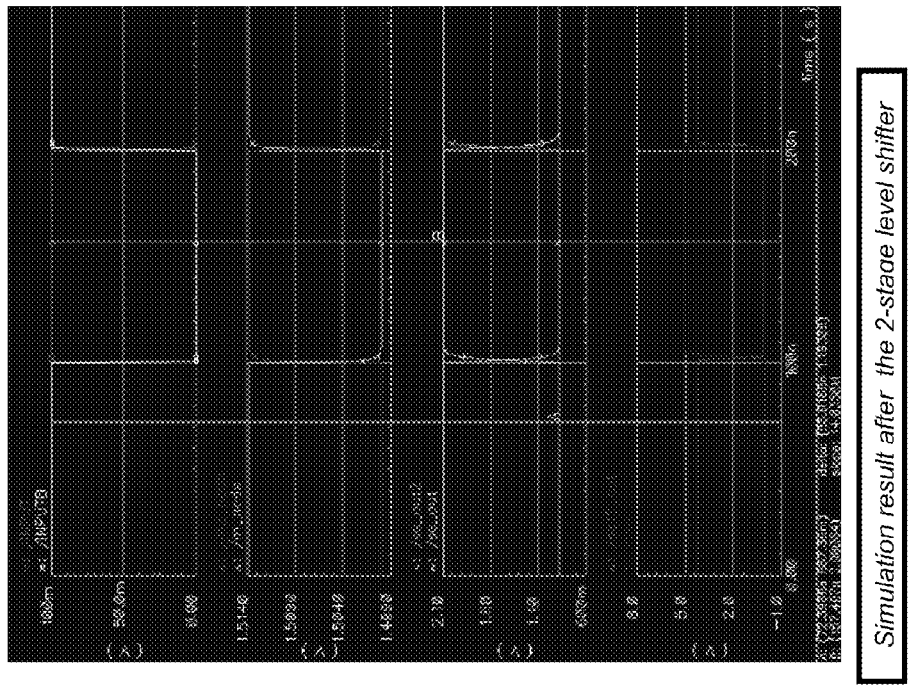
FIG. 17 shows a differential non volatile asynchronous latch and interface circuit to convert V1-V2 (e.g. 100 mV) into full rail (5V).
Figure 17:
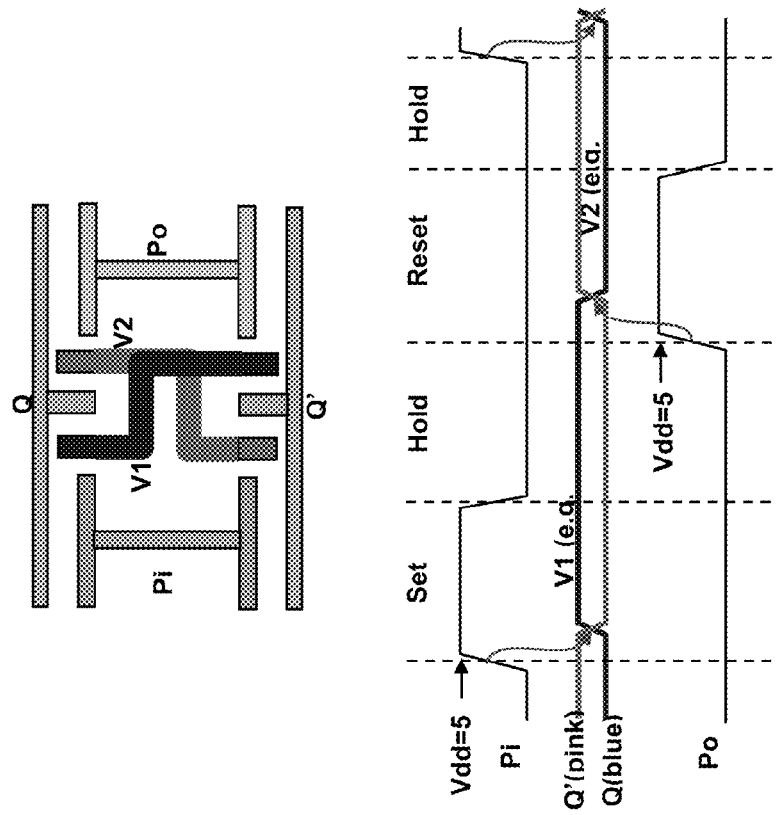
Figure 18:
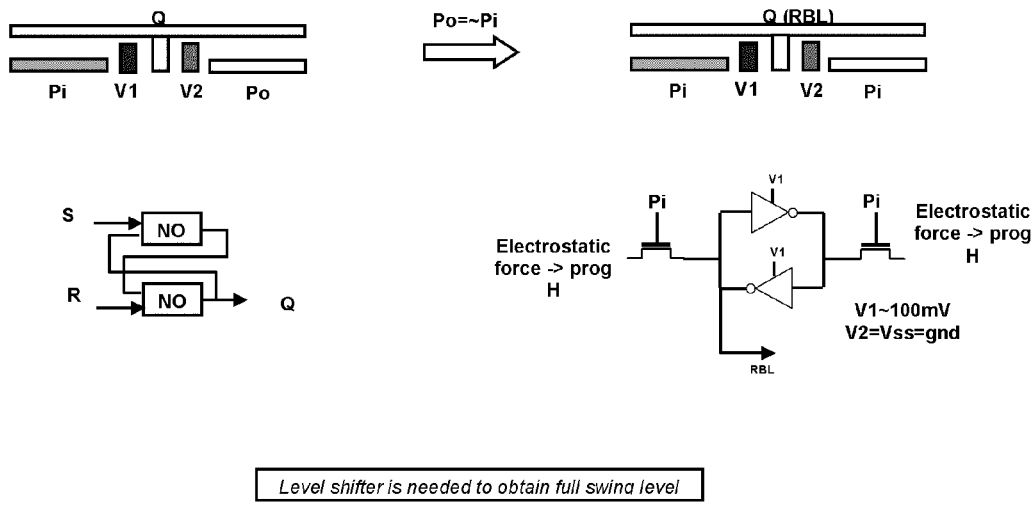
FIG. 18 shows a non-volatile latch from NV RS latch.
Figure 19:
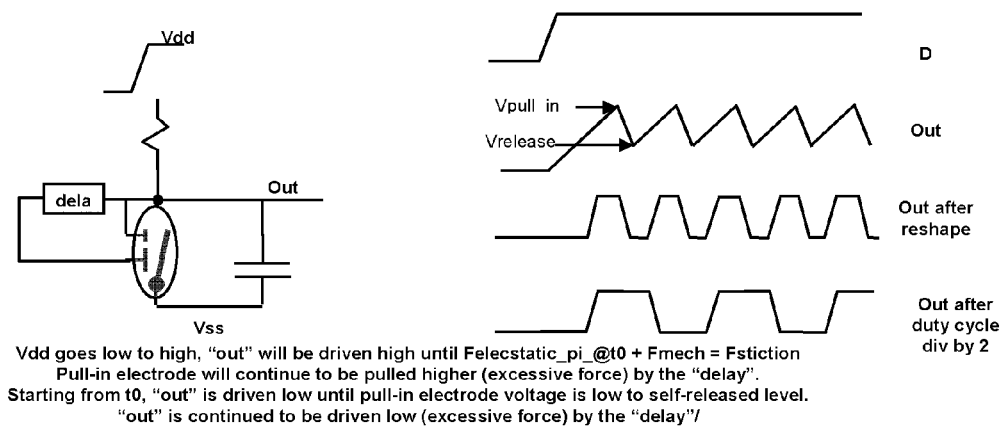
FIG. 19 shows an oscillator using self-released cantilevers.
Figure 20:
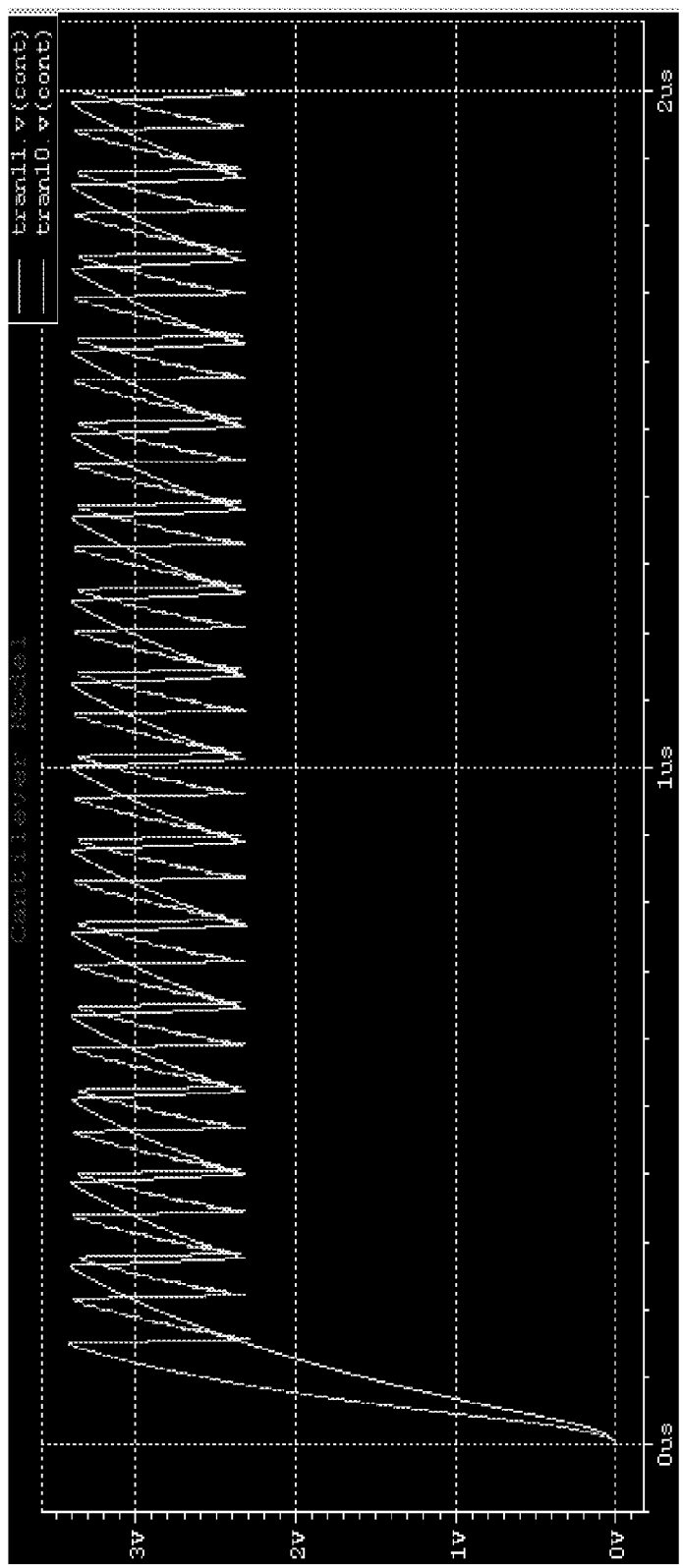
FIG. 20 shows a non-linear verilog for a cap of 50 fF and 100 fF.
Figure 21:
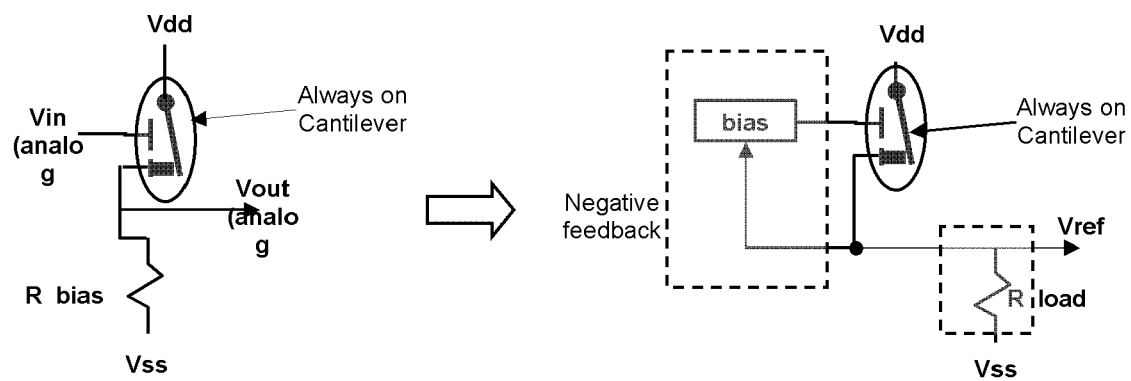
FIG. 21 shows a negative feedback voltage regulator.
Figure 22:
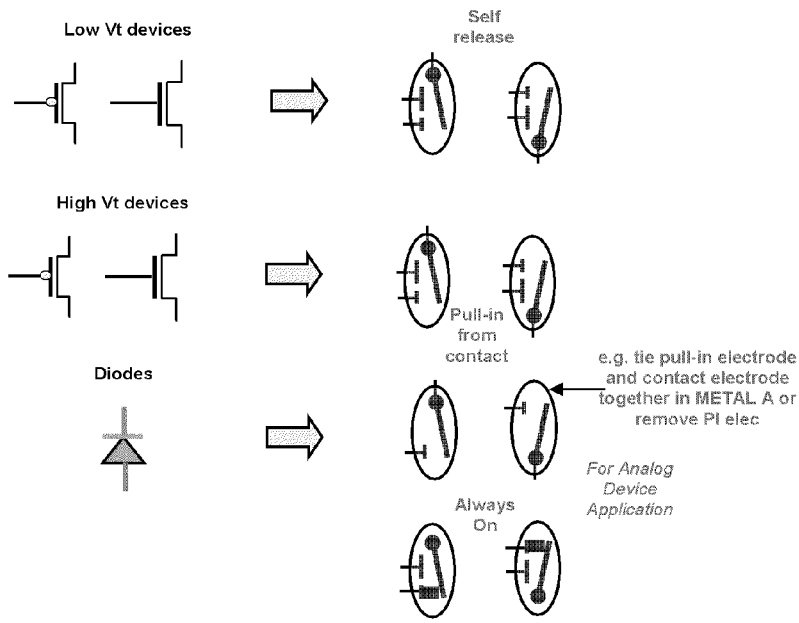
FIGS. 22 and 23 show a CMOS vs. MEMS device comparison.
Figure 23:
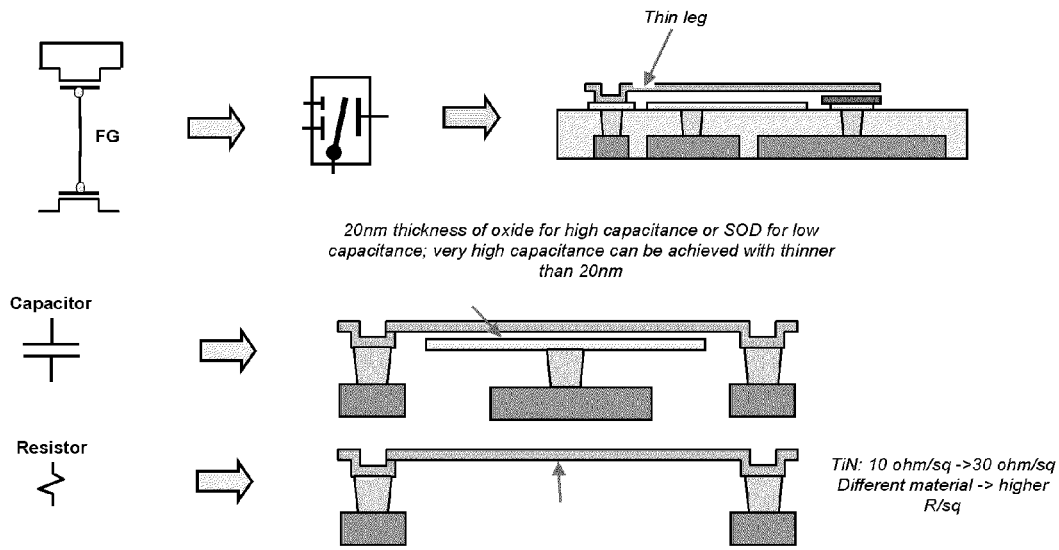

A 2-stage Op Amp with resistance mirror circuit is shown in FIG. 15 and may work when contact resistances are achieved. The contact resistances are quite similar for all devices on the chip. Other MEMS-only designs include a non-volatile, asynchronous RS latch using rocker device as shown in FIG. 16. A differential non volatile asynchronous latch and interface circuit to convert V1-V2 (e.g. 100 mV) into full rail (5V) is shown in FIG. 17. A non-volatile latch from NV RS latch is shown in FIG. 18. An oscillator using self-released cantilevers is one of several possible implementations in that is shown in FIG. 19. A non-linear verilog for a cap of 50 fF and 100 fF is shown in FIG. 20. A negative feedback voltage regulator is shown in FIG. 21. A CMOS vs. MEMS device comparison is shown in FIGS. 22 and 23.

nvSRAM is a type of non-volatile computer memory. It is similar in operation to SRAMs. Externally, nvSRAM looks like a standard SRAM. The HSB signal is an optional signal that does not have to be used. However, on the inside, there is a lot more going on, and the nvSRAM is capable of doing more than a standard SRAM. With nvSRAM, there are four operations compared to two in SRAM read/write. nvSRAM can read, write, store and recall. The additional operations center around the non-volatile part of the nvSRAM.

When reading and writing, the nvSRAM acts no differently than a standard async SRAM. The attached processor or controller sees an 8-bit SRAM interface and nothing else. The store operation is when the data that is in the SRAM array is stored in the non volatile part.

The nvSRAM utilizing MEMS devices disclosed herein creates a non-volatile copy of the SRAM data within each cell, but the used MEMS device can be put on top of the SRAM cell and does not require extra cell size. The extra process steps add a similar amount of cost to the process as EEPROM, but the cell size stays the same. The cell is approximately half of the cost of the existing nvSRAM solutions and utilizes one wafer. Splitting the cell over two different wafers such as done prior to the instant application (i.e., one wafer for SRAM process and one wafer for SONOS process) and glue the two wafers together is a poor alternative. First, splitting the cell requires two through-wafer via interconnects per cell, which would determine the cell size with today's technology. Second, the costs associated with utilizing two wafers are significant. Furthermore, today's EEPROM-based nvSRAM requires a long time (10 to 50 ms) and quite some current to store the data in the EEPROM cells. Therefore, EEPROM-based nvSRAMs require a large external capacitor, which stores sufficient energy to guarantee the required power to execute the storage action while the external power supply is already going down. Such an external capacitor adds to the cost and also requires space on the board.

The nvSRAM utilizing MEMS devices, on the other hand, takes less than 200 ns (depending on implementation of the MEMS devices) at a very small current, as it only is charging and discharging internal capacitance. The external capacitor can be much smaller and may be eliminated as the power supply lines on the board have sufficient capacitance to guarantee that it will power down much slower than the required 200 ns. Finally, the large charge pumps to generate the high-voltage for programming and erase are not needed. However, it is possible to utilize a 2*Vdd charge pump, but this is much less than what is used for program and erase of floating gate devices today.

The embodiments discussed herein add one or more MEMS switches to a standard SRAM cell architecture. Not all possible combinations will be described, but several variations are described, which can be combined in various ways. It is to be understood to those having ordinary skill in the art that the MEMS switches can be utilized in multiple different combinations. Certain signals can be inverted to achieve identical behavior.

Before describing the architecture, first the following restrictions for the MEMS switches need to be applied. The non-volatile 4-terminal MEMS devices are designed to behave symmetrically. Hence, as long as both the pull-up electrode and the pull-in electrode are at the same voltage, while the cantilever has a different voltage, they both execute an electro-static force on the cantilever. Depending on the current position of the cantilever, the electro-static force towards the closest electrode (i.e., pull-in electrode in closed position and pull-off electrode in open position) will always be larger than the electro-static force towards the other electrode. Therefore the switch will stay in its current position when there is no voltage difference between the pull-in and pull-off electrode. The two-contact rocker switches can be symmetrical by the design and therefore has fewer issues with respect to process variability.

Figure 24:
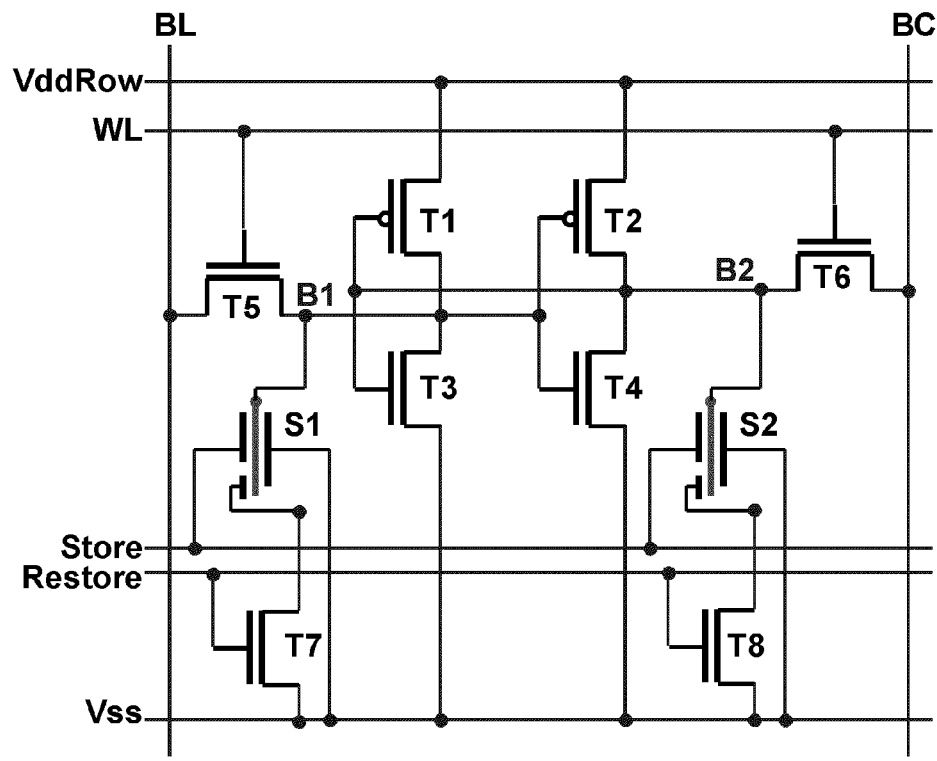
FIG. 24 shows an architecture with a standard SRAM cell utilizing MEMS devices.

FIG. 24 shows an architecture with a standard SRAM cell (T1 to T6). The cantilevers of the two MEMS switches (S1 and S2) are connected to both ends of the memory bit-cell (B1 and B2). The pull-in electrodes are connected to the STORE signal. The pull-off electrodes are connected to Vss, creating a difference between the electrodes when the STORE signal is active (HIGH). When the cantilever is HIGH, the electro-static force from the pull-off electrode opens the switch (when it was not yet open). When the cantilever is LOW, the electrostatic force from the pull-in electrode closes the switch. Hence, either S1 or S2 will be open and the other will be closed.

The cantilever devices may be designed as such that a voltage difference between the contact electrode and the cantilever does not result in a spurious closure of the switch. Furthermore the cantilever may be designed as such that no arbitrary write-sequence of the SRAM bitcell results in a resonance of the cantilever and therefore results in a spurious unintended switching of the cantilever device.

More specifically, in regards to FIG. 24, the nvSRAM includes at least one micro electromechanical device having four terminals, at least one transistor, a plurality of bit lines, a VddRow line, a word line, a store line, a restore line and a Vss line. The nvSRAM may include a first micro electromechanical device having a first pull-in electrode, a first pull-up electrode, a first contact electrode and a first cantilever electrode movable between a position in contact with the first contact electrode and a position spaced from the first contact electrode. The nvSRAM may also include a second micro electromechanical device having a second pull-in electrode, a second pull-up electrode, a second contact electrode and a second cantilever electrode movable between a position in contact with the second contact electrode and a position spaced from the second contact electrode.

A plurality of transistors may also be present that include source, drain and gate electrodes. In one embodiment, eighth transistors are present. The first source electrode and the second source electrode may be coupled to the VddRow line. A first drain electrode may be coupled to the third drain electrode and a first cantilever electrode. A second drain electrode may be coupled to the fourth drain electrode and a second cantilever electrode. A first gate electrode may be coupled to the third gate electrode and the second gate electrode may be coupled to the fourth gate electrode. The first cantilever electrode may be coupled to the first drain electrode, the third drain electrode, the second gate electrode, the fourth gate electrode and the fifth drain electrode. The second cantilever electrode may be coupled to the second drain electrode, the fourth drain electrode, the first gate electrode, and third gate electrode and the sixth drain electrode. The first pull-in electrode and the second pull-in electrode may each be coupled to the Store line. The first contact electrode may be coupled to the seventh drain electrode, and the second contact electrode may be coupled to the eighth drain electrode. The first pull-up electrode, the second pull-up electrode, the seventh source electrode and the eighth source electrode may each be coupled to the Vss line. The seventh gate electrode and the eighth gate electrode may each be coupled to the Restore line. The fifth source electrode may be coupled to a first bit line, and the sixth source electrode may be coupled to a second bit line. The fifth gate electrode and the sixth gate electrode may each be coupled to the word line. The plurality of bit lines may be parallel to each other and perpendicular to the VddRow, the word line, the Store line, the Restore line, and the Vss line.

Figure 25:
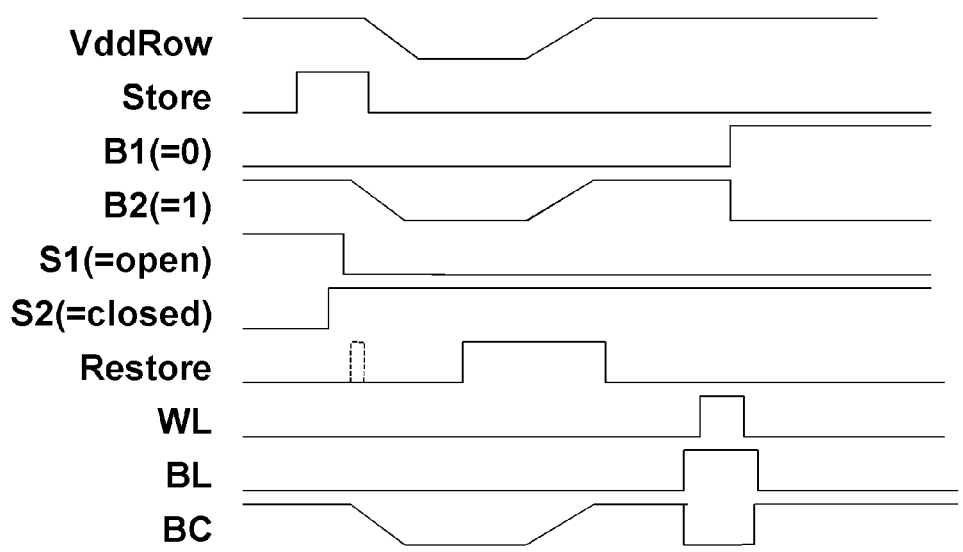
FIG. 25 shows the voltage application during operation of the SRAM cell of FIG. 24.

An optional activation of the RESTORE signal (see FIG. 25) at the end of the STORE action just before the STORE signal will be de-activated, which will change the voltage on the contact electrode will have no impact on the switching behavior. In normal operation the RESTORE signal is LOW and makes sure there is no connection to the contact electrode. When the data from the switches need to be restored into the SRAM cell, the RESTORE signal goes HIGH and transistors T7 and T8 will be switched on, connecting the contact electrode to Vss. Hence, depending on which switch is closed either node B1 or B2 has a low resistance path to Vss.

When the restore action takes place after power-up it may be that the SRAM cell has come up in the other value and hence a large current path through one of the switches exist. Therefore, special care needs to be taken during the restore action and the power supply to the SRAM cell VddRow needs to be low when the RESTORE signal goes HIGH. Now, assume S1 is closed and therefore node B1 has a low resistance path to Vss. All four transistors (T1 to T4) forming the cross-coupled SRAM memory element are still switched off. Now VddRow can be ramped up slowly to become HIGH and T2 and T3 will be slowly switched on, putting the SRAM cell in its right position. The RESTORE signal remains HIGH during the ramp of VddRow. Obviously, when S2 was closed, B2 has a low resistance path to Vss and T1 and T4 will be switched on during the power ramp, providing the other bit position.

The cell architecture allows executing STORE and RESTORE actions per row. This might be a feature which can be useful for some application and used under software control. However, the main drive for nvSRAM is protection against power failures and obviously the whole array needs to be saved. Still, the architecture of FIG. 24 has two extra transistor resulting in extra area. However, as these transistors are only used for the RESTORE action, they will be used only a limited amount of times. Hence, these transistors can also be replaced by a volatile version of the MEMS switch. Such a volatile version can be designed within the same process steps by using other design parameters (e.g., smaller contact area, stiffer cantilever, etc. . . . ) than for the non-volatile switch.

Figure 26:
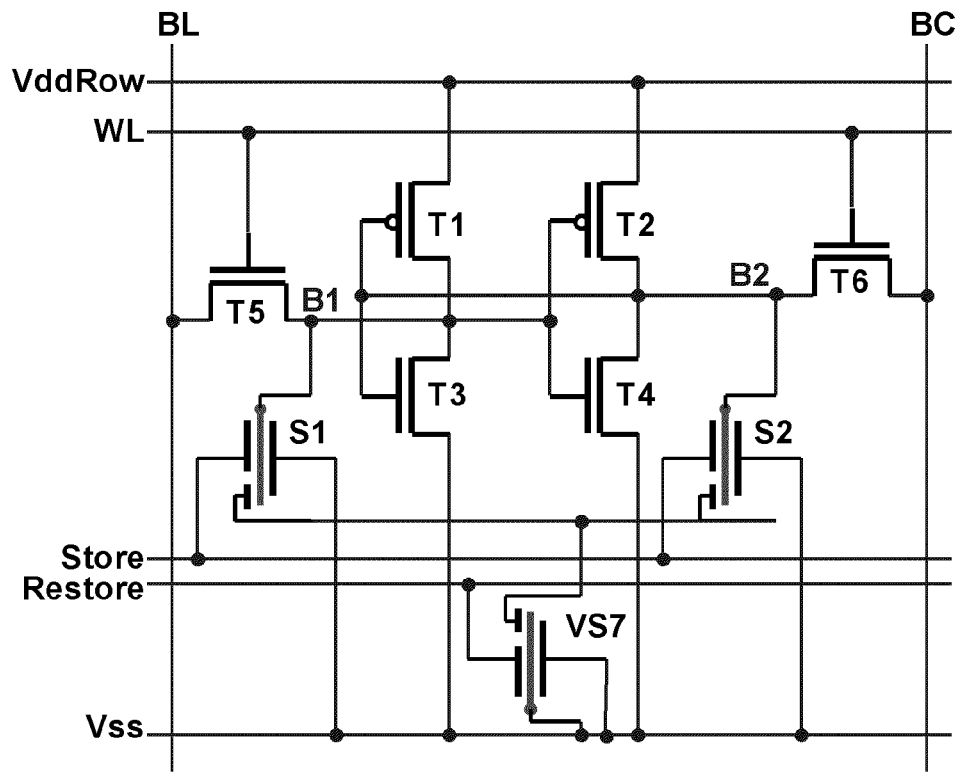
FIG. 26 shows an architecture of a SRAM cell in which several transistors are replaced by a volatile MEMS switch VS7.
Figure 27:
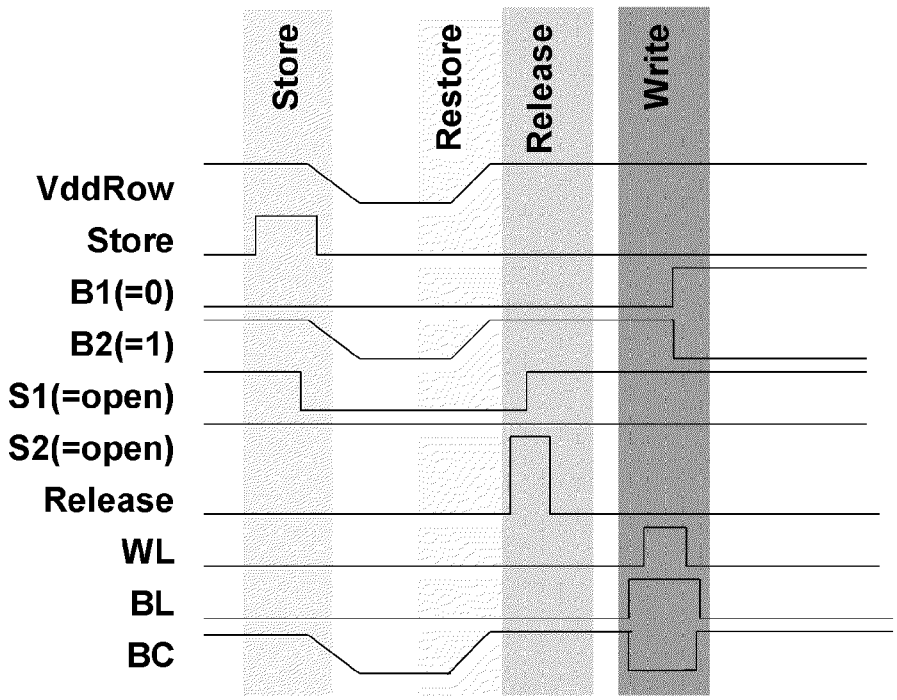
FIG. 27 shows the voltage application during operation of the SRAM cell of FIG. 26.

A further reduction can be achieved, when taking into account that, when activated simultaneously, a closed switch will open before an open switch will close. In such case, both contact electrodes of the MEMS switches S1 and S2 can be connected together as no short can occur between B1 and B2 during the STORE operation. Hence, transistors T7 and T8 can become one transistor and drive the combined contact electrodes. FIG. 26 describes this, where also the transistors (T7 and T8) are replaced by a volatile MEMS switch VS7.

Depending on the process and the requirements, the design of 3 MEMS switches (S1, S2 and VS7) may be larger than the area consumed by the 6 SRAM transistors. As a further reduction, the volatile MEMS switch of FIG. 24 (or T7 and T8 of FIG. 24) can be removed and the contact electrodes of switches S1 and S2 are directly connected to Vss (see FIG. 26).

The nvSRAM device of FIG. 26 includes at least one volatile micro electromechanical device having four terminals, at least one non-volatile micro electromechanical device having four terminals, at least one transistor, a plurality of bit lines, a VddRow line, a word line, a store line, a restore line and a Vss line. More specifically, the at least one non-volatile micro electromechanical device includes a plurality of micro electromechanical devices. The first micro electromechanical device includes a first pull-in electrode, a first pull-up electrode, a first contact electrode and a first cantilever electrode movable between a position in contact with the first contact electrode and a position spaced from the first contact electrode. The second micro electromechanical device has a second pull-in electrode, a second pull-up electrode, a second contact electrode and a second cantilever electrode movable between a position in contact with the second contact electrode and a position spaced from the second contact electrode. The at least one transistor includes six transistors that each have a source, drain and gate electrode. A third micro electromechanical device may also be present that includes a third pull-in electrode, a third pull-up electrode, a third contact electrode and a third cantilever electrode movable between a position in contact with the third contact electrode and a position spaced from the third contact electrode. The first pull-up electrode, the third source electrode, the third cantilever electrode, the third pull-up electrode, the fourth source electrode and the second pull-up electrode are each coupled to the Vss line. The third pull-in electrode is coupled to the Restore line. The first pull-in electrode and the second pull-in electrode are coupled to the Store line. The fifth gate electrode and the sixth gate electrode are each coupled to the word line. The first source electrode and the second source electrode are each coupled to the VddRow line. The fifth source electrode and the sixth source electrode are each coupled to a separate bit line. The first cantilever, the first drain electrode, the third drain electrode, the second gate electrode, the fourth gate electrode and the fifth drain electrode are all coupled together. The first gate electrode, the third gate electrode, the second drain electrode, the fourth drain electrode, the sixth drain electrode, and the second cantilever electrode are all coupled together. The first contact electrode, the second contact electrode and the third pull-in electrode are all coupled together. The bit lines are parallel to each other and perpendicular to the VddRow line, the word line, the Store line, the Restore line and the Vss line The nvSRAM device of FIG. 28 includes a plurality of micro electromechanical device having four terminals, a plurality of transistors, a plurality of bit lines, a VddRow line, a word line, a store line, a release line and a Vssr line. The plurality of micro electromechanical device includes at least two micro electromechanical devices. A first micro electromechanical device includes a first pull-in electrode, a first pull-up electrode, a first contact electrode and a first cantilever electrode movable between a position in contact with the first contact electrode and a position spaced from the first contact electrode. A second micro electromechanical device having a second pull-in electrode, a second pull-up electrode, a second contact electrode and a second cantilever electrode movable between a position in contact with the second contact electrode and a position spaced from the second contact electrode. The plurality of transistor includes six transistors each having a source, drain and gate electrode. The first contact electrode, the third source electrode, the fourth source electrode and the second contact electrode are each coupled to the Vssr line. The first pull-up electrode and the second pull-up electrode are each coupled to the Release line. The first pull-in electrode and the second pull-in electrode are each coupled to the Store line. The fifth gate electrode and the sixth gate electrode are each coupled to the word line. The first source electrode and the second source electrode are each coupled to the VddRow line. The fifth source electrode is coupled to a first bit line and the sixth source electrode is coupled to a second bit line. The fifth drain electrode, the first drain electrode, the third drain electrode, the second gate electrode, the fourth gate electrode and the first cantilever electrode are all coupled together. The first gate electrode, the third gate electrode, the second drain electrode, the fourth drain electrode and the second cantilever electrode are all coupled together. The bit lines are parallel to each other and perpendicular to each of the VddRow line, the word line, the Store line, the Release line and the Vssr line. The RESTORE signal is no longer used and the restore action is executed by ramping VddRow only.

Clearly, this can only work when the MEMS switches S1 and S2 are both open, when returning to normal operation and the bit can be written into its other position. Therefore, the pull-off electrodes need to be connected to a RELEASE signal, which will be activated after a restore action, by VddRow, and before any WRITE action.

When using a RELEASE signal at same level as VddRow, the closed cantilevers (=LOW) will be opened. Unfortunately, the open cantilevers (=HIGH) will be attracted by the pull-in electrode (=LOW) and will short the SRAM cell through such switch. To avoid this, the RELEASE signal needs to get twice the voltage of VddRow and the signal needs to ramp faster than the time needed to pull-in a cantilever. Now, for an open cantilever (=HIGH) the absolute value of the voltage difference between cantilever (HIGH) and pull-in electrode is identical to the voltage difference between cantilever and pull-off electrode and due to its open position, the electrostatic force from the pull-off electrode is larger and the cantilever will continue to be held in an open position. The originally closed cantilever (=LOW) will have no electrostatic force from the pull-in electrode, but an extra large electrostatic force from the pull-off electrode, assuring the cantilever will open. Also, the RELEASE signal needs to ramp-down faster than the time needed to pull-in a cantilever, to avoid closing the open switch at the end of the RELEASE action. Some extra care might be required with the design of the MEMS switch to allow such higher voltage on the pull-off electrode.

To even further reduce the amount of MEMS switches, the architecture of the SRAM cell can be adapted. The dimensions of the transistors T1 to T4 can be designed as such that (with no MEMS switches connected) node B1 always will be HIGH after the power-up sequence. Note that this will also have an effect on the performance of the SRAM cell. When we connect a MEMS switch to node B1 and the cantilever is closed, the low resistance path through the MEMS switch will force B1 to LOW. Due to this asymmetry, the MEMS switch to drive node B2 is not required and a minimum architecture is achieved.

Finally, to avoid the double voltage on the RELEASE signal, it also possible to ramp VddRow in two stages, assuming that half the voltage will also allow the transistors to switch on. Now, VddRow first ramps to half voltage and all bits get set by this event. Next, the RELEASE signal is applied at full voltage to open all MEMS switches and VddRow is also ramped to full voltage. After that, normal operation can continue.

Also, a "rocker switch", which has two contact electrodes and shared cantilever electrode can be used and one rocker basically replaces the two cantilever switches of FIG. 24, while transistor T8 switches the extra contact electrode to Vdd. The implementation with a rocker is described in FIG. 30.

Figure 30:
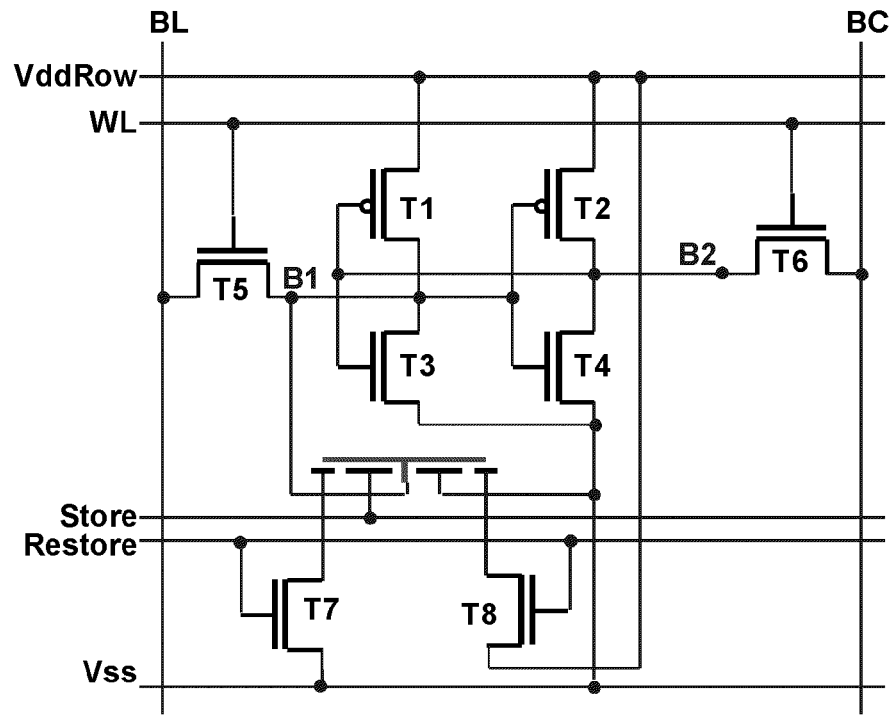
FIG. 30 shows an architecture with a standard SRAM cell utilizing MEMS devices according to another embodiment.

The nvSRAM device of FIG. 30 includes at least one micro electromechanical device having a first contact electrode, a second contact electrode, a first pull-in electrode, a second pull-in electrode. The nvSRAM device also includes a rocker electrode movable from a position in contact with the first contact electrode to a position spaced from both the first contact electrode and the second contact electrode to a position in contact with the second contact electrode. The nvSRAM device also includes at least one transistors, a plurality of bit lines, a VddRow line, a word line, a store line, a restore line and a Vss line. The at least one transistor includes eight transistors each having a source, drain and gate electrode. The seventh source electrode, the third source electrode, the fourth source electrode and the second pull-in electrode are each coupled to the Vss line. The seventh gate electrode and the eighth gate electrode are each coupled to the Restore line. The first pull-in electrode is coupled to the Store line. The fifth gate electrode and the sixth gate electrode are each coupled to the word line. The first source electrode, the second source electrode and the eighth source electrode are each coupled to the VddRow line. The fifth source electrode and the sixth source electrode are each coupled to separate bit lines. The fifth drain electrode, the rocker electrode, the first drain electrode, the third drain electrode, the second gate electrode and the fourth gate electrode are all coupled together. The first gate electrode, the third gate electrode, the second drain electrode, the fourth drain electrode and the sixth drain electrode are all coupled together. The seventh drain electrode is coupled to the first contact electrode and wherein the eighth drain electrode is coupled to the second contact electrode. The plurality of bit lines are parallel to each other and perpendicular to the VddRow line, the word line, the Store line, the Restore line and the Vss line.

When the STORE signal is LOW both activation-electrodes are LOW and when the rocker is also LOW there is no activation and the rocker stays in its current position. When the rocker is HIGH (hence B1 is HIGH), the electrostatic force at the position where the rocker is closed will always be stronger than on the other side and therefore the rocker remains in its current position. When the STORE signal goes HIGH while the cantilever is LOW, only the left electrode will pull and the rocker will move to the left contact electrode, when not already there. When the STORE signal is HIGH while the cantilever is HIGH, only the right electrode will pull and the rocker will move to the right contact electrode, when not already there.

When the RESTORE signal goes HIGH, transistors T7 and T8 will switch on and the rocker will create either a low resistance path to Vss or VddRow, depending on the state of the rocker. After RESTORE signal goes HIGH, VddRow can be ramped up to HIGH, too. The waveforms of FIG. 25 apply here as well, where S1 and S2 represent the rocker to be closed at the left resp. right side.

Replacing the transistors T7 and T8 with a volatile cantilever device as described in FIG. 26 can be done here, too. As T8 is now connected to VddRow, it can not be merged with T7 anymore.

Figure 28:
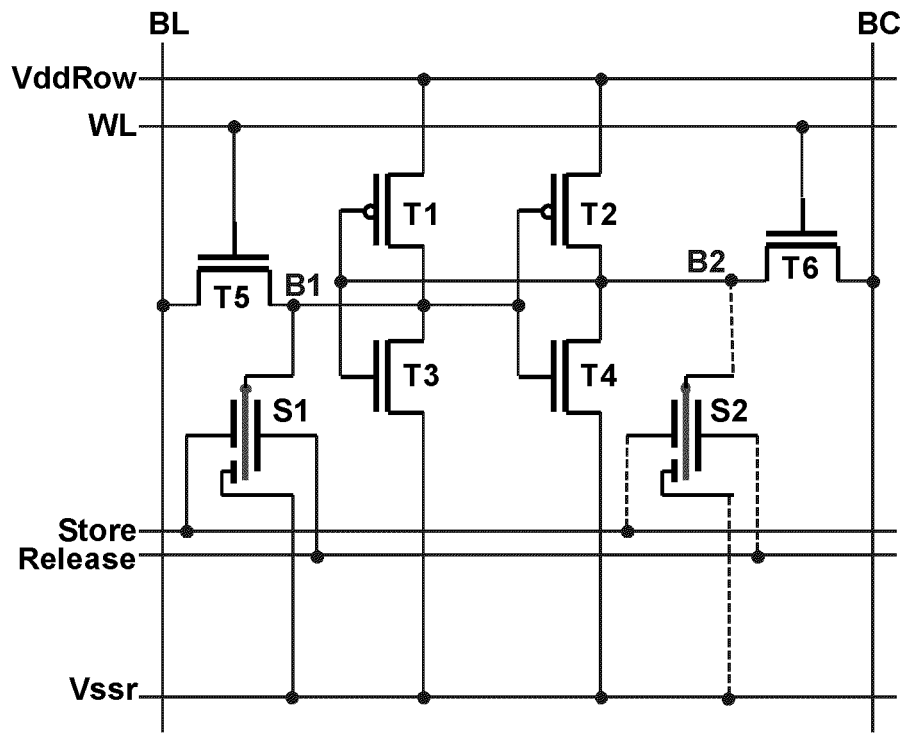
FIG. 28 shows an architecture with a standard SRAM cell utilizing MEMS devices according to another embodiment.
Figure 29:
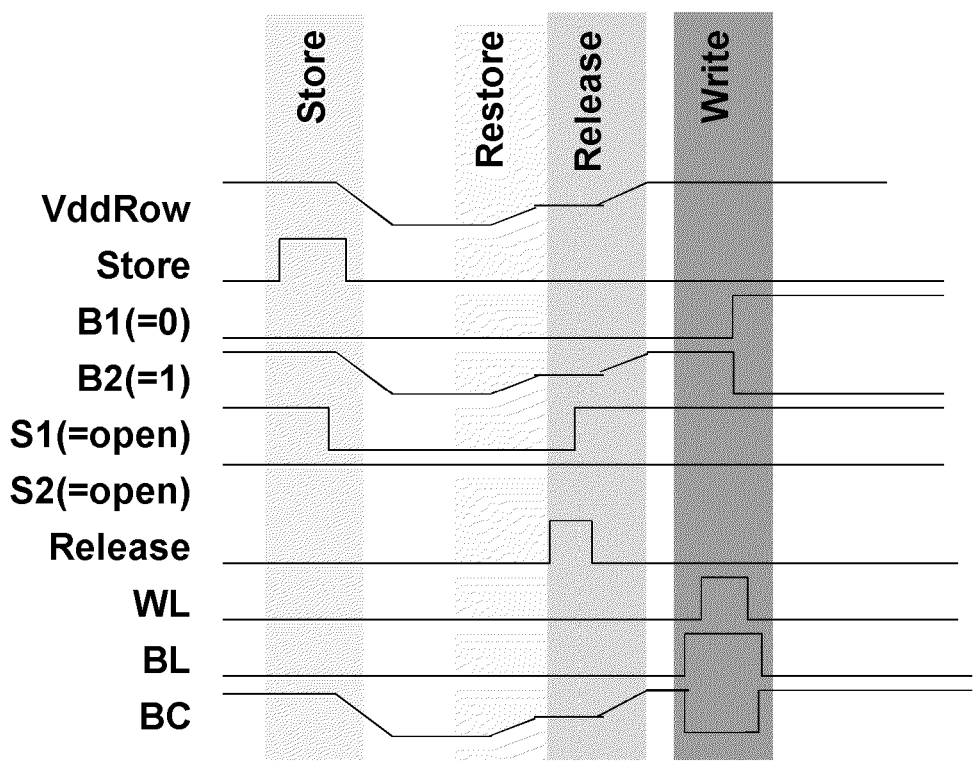
FIG. 29 shows the voltage application during operation of the SRAM cell of FIG. 24.

In theory, also a similar architecture as FIG. 28 can be realized with a rocker device. However, for normal operation the rocker would need to be put into a third position, which is the middle state, where it does not make contact to any of the contact electrodes. Currently, we have no means to make this a stable state for this device.

Also, the rocker of FIG. 30 has some constraints. Hence it should be designed as such that a voltage on a contact electrode can never switch the device. Also, the rocker should be designed as such that resonating the pull-in electrode (due to the write-sequence on the SRAM cell) should not put the cantilever into a resonance, which could cause the device to switch.

Figure 31:
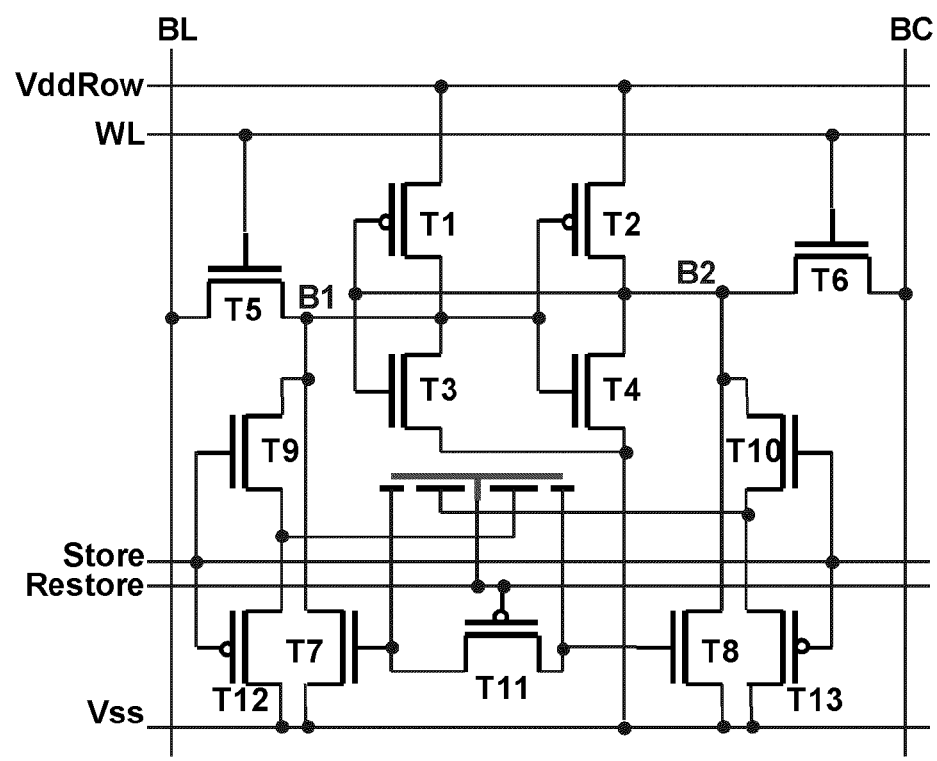
FIG. 31 shows an architecture with a standard SRAM cell utilizing MEMS devices according to another embodiment.

A more complex device is shown in FIG. 31, which puts less constraints on the rocker device. The nvSRAM device includes at least one micro electromechanical device having a first contact electrode, a second contact electrode, a first pull-in electrode, a second pull-in electrode. The nvSRAM device also includes a rocker electrode movable from a position in contact with the first contact electrode to a position spaced from both the first contact electrode and the second contact electrode to a position in contact with the second contact electrode. The nvSRAM device also includes thirteen transistors, a plurality of bit lines, a VddRow line, a word line, a store line, a restore line and a Vss line. Each of the thirteen transistors includes a source, a drain and a gate electrode. The twelfth source electrode, the seventh source electrode, the third source electrode, the fourth source electrode, the eighth source electrode and the thirteenth source electrode are all coupled to the Vss line. The rocker electrode and the eleventh gate electrode are each coupled to the Restore line. The ninth gate electrode, the twelfth gate electrode, the tenth gate electrode and the thirteenth gate electrode are all coupled to the Store line. The fifth gate electrode and the sixth gate electrode are each coupled to the word line. The first source electrode and the second source electrode are each coupled to the VddRow line. The fifth source electrode and the sixth source electrode are each coupled to a separate bit line. The ninth drain electrode, the twelfth drain electrode and the second pull-in electrode are all coupled together. The tenth drain electrode and the thirteenth drain electrode are each coupled to the first pull-in electrode. The first contact electrode, the seventh gate electrode and the eleventh drain electrode are all coupled together. The second contact electrode, the eighth gate electrode and the eleventh source electrode are all coupled together. The fifth drain electrode, the ninth source electrode, the seventh drain electrode, the third drain electrode, the first drain electrode, the second gate electrode and the fourth gate electrode are all coupled together. The first gate electrode, the third gate electrode, the second drain electrode, the fourth drain electrode, the sixth drain electrode, the tenth source electrode, and the eighth drain electrode are all coupled together. The fifth source electrode and the sixth source electrode are each coupled to separate bit lines. The plurality of bit lines are parallel to each other and perpendicular to the VddRow line, the word line, the Store line, the Restore line and the Vss line.

During normal operation, all electrodes are grounded and therefore, the two above-mentioned constraints are not required. Also when switching, it will always land on a contact electrode with the same voltage as the cantilever (so-called 'cold switching'), which is considered to be a safer way of switching. This architecture also allows restoring during normal operation (hence VddRow is high). This is a major benefit for some applications. The cantilever only drives the gate of a transistor and does not 'see' a path to ground or Vdd through one of the transistors of the cross-coupled inverters of the SRAM cell. Therefore, it is not required any more to start a restore operation with VddRow starting at 0 Volt.

The transistors T12 and T13 make sure the pull-in electrodes are grounded during normal operation. Transistor T11 makes sure the floating contact electrode get grounded (through the cantilever) during normal operation. During a store operation transistors T9 and T10 connect the SRAM bitcell value (B1 and complementary B2) to the pull-in electrode and the cantilever will switch to the right position. During a restore operation either T7 or T8 gets activated (as the restore signal runs through the cantilever) and will ground either B1 or B2 forcing the SRAM bitcell to the information stored in the cantilever position. Still, more circuits with a rocker device are possible, but they are considered to be some derivatives or combinations of any of these architectures, like FIG. 32.

Figure 32:
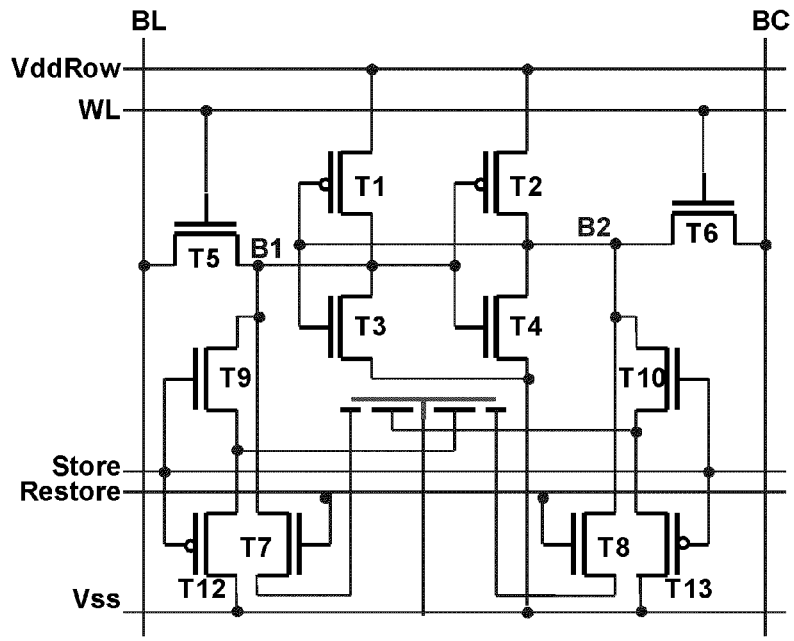
FIG. 32 shows an architecture with a standard SRAM cell utilizing MEMS devices according to another embodiment.

The nvSRAM device of FIG. 32 includes at least one micro electromechanical device having a first contact electrode, a second contact electrode, a first pull-in electrode, a second pull-in electrode. The nvSRAM device also includes a rocker electrode movable from a position in contact with the first contact electrode to a position spaced from both the first contact electrode and the second contact electrode to a position in contact with the second contact electrode. The nvSRAM device also includes thirteen transistors, a plurality of bit lines, a VddRow line, a word line, a store line, a restore line and a Vss line. The twelve transistors each include a source, drain and gate electrode. The eleventh source electrode, the twelfth source electrode, the third source electrode, the fourth source electrode, and the rocker electrode are each coupled to the Vss line. The seventh gate electrode and the eighth gate electrode are each coupled to the Restore line. The eleventh gate electrode, the ninth gate electrode, the tenth gate electrode and the twelfth gate electrode are each coupled to the Store line. The fifth gate electrode and the sixth gate electrode are each coupled to the word line. The first source electrode and the second source electrode are each coupled to the VddRow line. The fifth source electrode and the sixth source electrode are each coupled to separate bit lines. The eleventh drain electrode, the ninth drain electrode and the second pull-in electrode are all coupled together. The twelfth drain electrode, the tenth drain electrode and the first pull-in electrode are all coupled together. The seventh drain electrode, the ninth source electrode, the fifth drain electrode, the first drain electrode, the third drain electrode, the second gate electrode and the fourth gate electrode are all coupled together. The eighth drain electrode, the tenth source electrode, the sixth drain electrode, the second drain electrode, the fourth drain electrode, the first gate electrode and the third gate electrode are all coupled together. The seventh source electrode is coupled to the first contact electrode. The eighth source electrode is coupled to the second contact electrode. The plurality of bit lines are parallel to each other and perpendicular to the VddRow line, the word line, the Store line, the Restore line and the Vss line.

The MEMS NAND architecture doesn't have any CMOS transistor in the cell; therefore, the mentioned MEMS memory cell area could be used be for other purposes including decoders, SA, etc. In addition, the NAND architecture allows sharing (e.g., in the same cavity and/or cont/cant sharing node) which makes the MEMS cell smaller than separate MEMS cell in NOR architecture. This further reduces memory array area.

The main advantage of MEMS NAND architecture is area. The area underneath the MEMS memory cell array can be used. The area for MEMS devices is also less because cavity sharing and contact/cant sharing. The total area saving will be 50% or more. The disadvantage of MEMS NAND architecture is the READ access time and READ scheme because the resistance of the cells are in series.

The cantilever operates in two modes. One mode is self-released mode where cantilever will be pulled in at certain voltage (e.g., 5V in the example) and the $R_{cant}$ will be about 10 Kohm. As soon as the electrostatic force is removed, the cantilever will go back to open state. The other mode is non-volatile mode where the state of cantilever (closed or open) will be maintained even after the electrostatic force is removed.

In order to get cantilevers in non-volatile mode, excessive force is required. Excessive force can be achieved in different ways:

$$Fe \sim D(V^2 - Vpi^2)$$

where D=1 for SR of switch speed, D=2 for SR>10 switch speed and D=2, 3, 4, 5 with respect to # of pulses at resonance frequency.

One manner of achieving excessive force is in the form of voltage used to demonstrate the concept of MEMS NAND architecture. In alternative implementations, other means such as slew rate and resonance frequency are mentioned. All of the MEMS cells are together and there are no NMOS devices in the MEMS array. The block select circuit is only at the beginning of the array.

Figure 33:
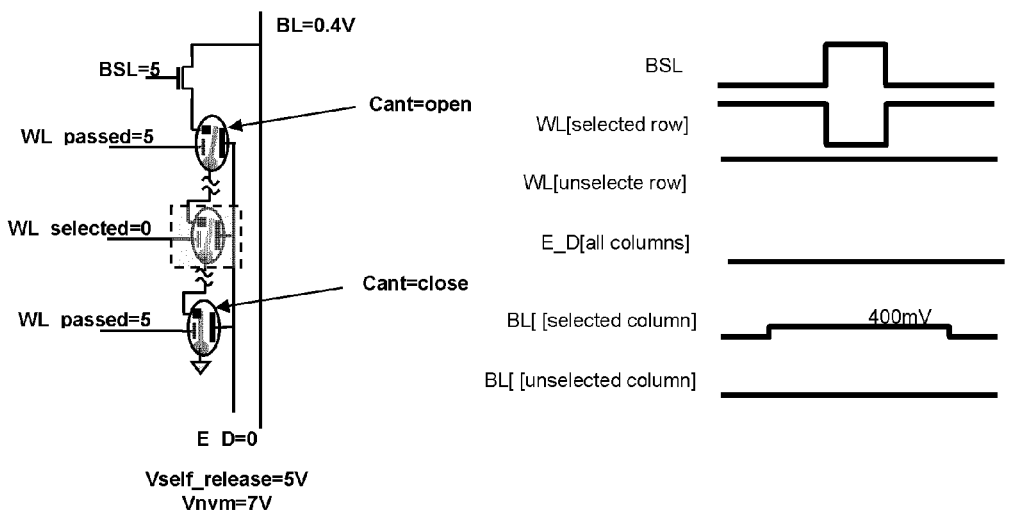
FIG. 33 shows a MEMS NAND architecture according to one embodiment.

To make everything MEMS only design, the block select devices can be replaced with self-released devices. An example of MEMS NAND architecture is shown in FIG. 33. The NAND device includes a first micro electromechanical device having a first pull-up electrode, a first pull-in electrode, a first contact electrode and a first cantilever electrode movable between a position in contact with the first contact electrode and a position spaced from the first contact electrode. The NAND device also includes a second micro electromechanical device having a second pull-up electrode, a second pull-in electrode, a second contact electrode and a second cantilever electrode movable between a position in contact with the second contact electrode and a position spaced from the second contact electrode, the second cantilever electrode is coupled to the first contact electrode. The NAND device also includes a first word line coupled to the first pull-in electrode, a second word line coupled to the second pull-in electrode, a Vss line coupled to the first cantilever electrode and a transistor coupled to the second micro electromechanical device. The transistor comprises a drain electrode coupled to the second contact electrode, a gate electrode and a source electrode. The NAND device also includes a bit select line coupled to the gate electrode and a bit line coupled to the source electrode. The NAND-based non-volatile memory architecture also includes a data line coupled to the first pull-up electrode and the second pull-up electrode.

FIG. 33 shows a READ operation. Cantilever of the last MEMS is connected to VSS; therefore, as soon as WL is asserted (e.g., at 5V), the cantilever will be pulled in (self-release mode). Similarly, all MEMS cells below the selected cell will be pulled in which sets cantilever of the selected cell near zero voltage. The WL for the selected row is low (e.g., 0V). If the selected cell is open, there will be no current flowing through the block. The state of cantilevers that are above the selected cell is not important.

If the selected cell is closed, the current will flow through the cell which sets the cantilever of the cell right above of the selected cell zero. Because the unselected row is set at 5V, the cell will be pulled-in. This ripple effect will continue until the first cells in the first row. Then it provides current path from BL to VSS. The method of reading includes applying a first voltage to the first word line, applying a second voltage to the second word line that is less than the first voltage, applying a third voltage to the bit select line that is substantially equal to the first voltage, applying a fourth voltage to the bit line that is less than the third voltage and greater than the second voltage, moving the first cantilever electrode to a position in contact with the first contact electrode, and moving the second cantilever electrode to a position in contact with the second contact electrode.

Figure 34:
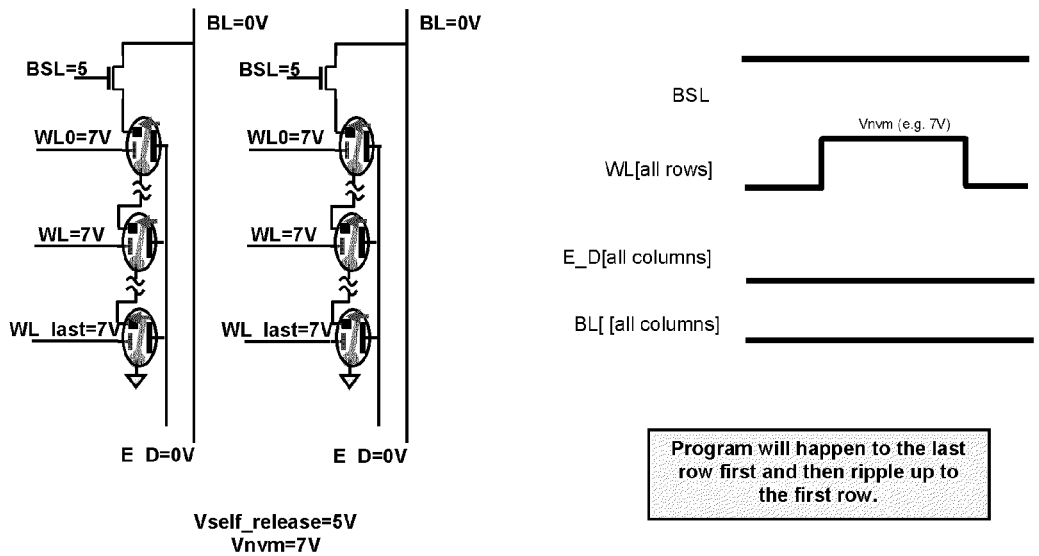
FIG. 34 shows a PROG ALL operation for a MEMS NAND architecture according to one embodiment.

FIG. 34 shows a PROG ALL operation. With sufficient excessive force (e.g., 7V at pull-in electrodes), the last row of cantilevers will be pulled in. This effect will be rippled from the last row to the first row and the whole block will be programmed. The method of programming includes applying a first voltage to the first word line, applying a second voltage to the second word line that is substantially equal to the first voltage, applying a third voltage to the bit select line that is less than the first voltage, applying a fourth voltage to the bit line that is less than the third voltage, moving the first cantilever electrode to a position in contact with the first contact electrode and moving the second cantilever electrode to a position in contact with the second contact electrode.

Figure 35:
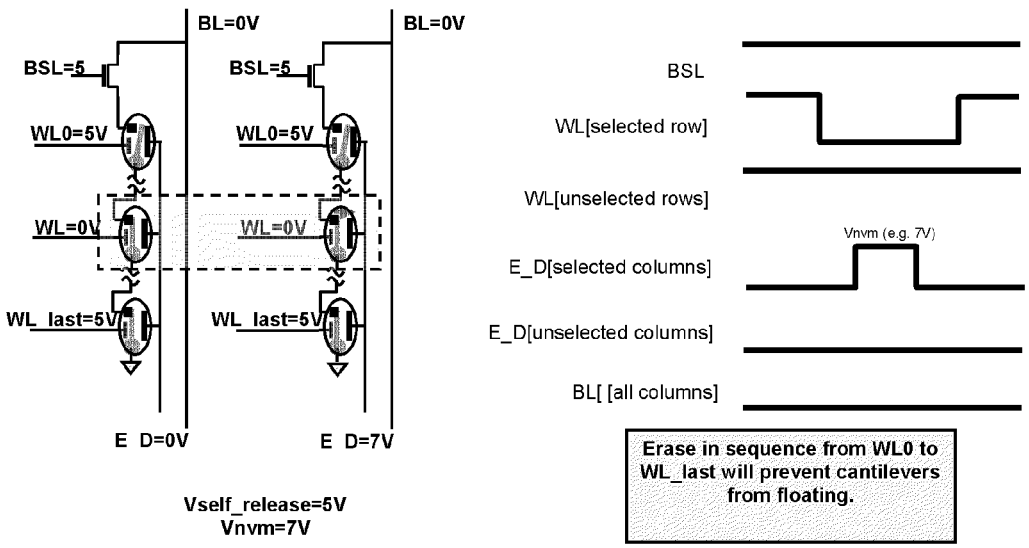
FIG. 35 shows an erase operation for a MEMS NAND architecture according to one embodiment.

FIG. 35 shows an erase operation. WLs for unselected cells are at 5V while WL of the selected cells is at 0V. If data is 0V (e.g., E_D=0V), the cell will not be erased. If data is 7V (e.g., E_D=7V), the cell at this column will be erased. With 5V at unselected cells on the same column, the net electrostatic force is only 7V−5V=2V which is not sufficient to have accidental erase. Most of NAND architecture will do both PROG all for the whole block and ERASE for selected cells for the whole block. The method of erasing includes applying a first voltage to the first word line, applying a second voltage to the second word line that is less than the first voltage, applying a third voltage to the bit select line that is substantially equal to the first voltage, applying a fourth voltage to the bit line that is less than the third voltage and greater than the second voltage, applying a fifth voltage to the data line that is greater than the first voltage, moving the first cantilever electrode to a position spaced from the first contact electrode and moving the second cantilever electrode to a position spaced from the second contact electrode.

To avoid a possibility of cantilever being floating, the ERASE for selected cells will be done for the whole block with the sequence from the last row to the first row. This constraint can be implemented within the memory controller or as the external requirement.

Figure 36:
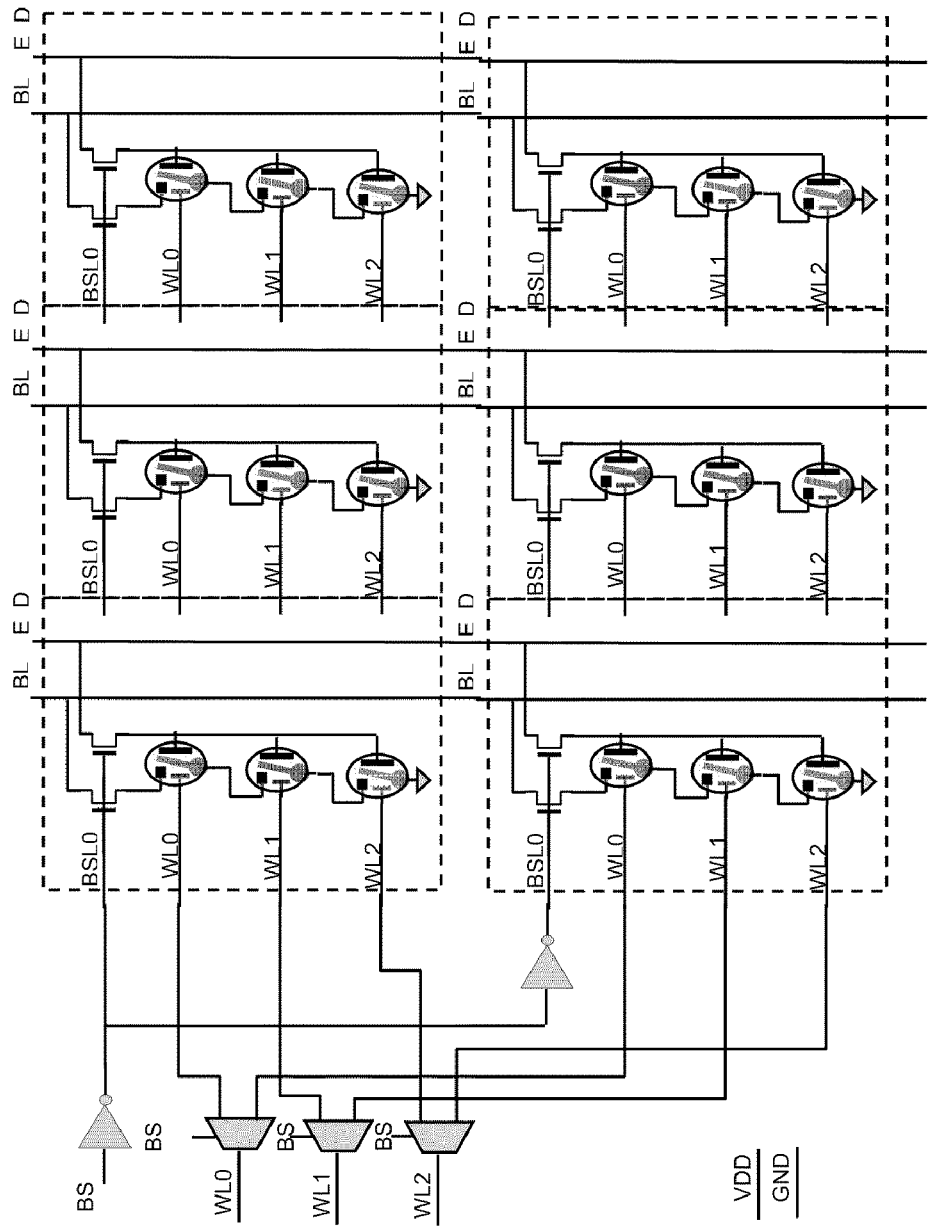
FIG. 36 shows an example of MEMS NAND analog array organization according to one embodiment.

Alternative memory operations are the slow rate approach and the resonance frequency approach. Using the slow rate approach, there is no need to have 5V for passing and 7V for programming. For example for passing, slow slew rate will be used, for PROG/ERASE, fast slew rate will be used. Using the resonance frequency approach, resonance frequency could be used for block erase at pull-in electrodes or top electrodes. Resonance frequency could be used as scrubbing contact while being pulled in to establish non volatile cantilevers during the PROG operation. An example of MEMS NAND analog array organization is shown in FIG. 36. The array includes a first word line, a second word line, a third word line, a first bit select line, a first bit line, a second bit line, a third bit line, a first data line, a second date line and a third data line. The array also includes a first micro electromechanical device having a first pull-in electrode coupled to the first word line, a first contact electrode, a first pull-up electrode and a first cantilever electrode. The array also includes a second micro electromechanical device having a second pull-in electrode coupled to the second word line, a second contact electrode coupled with the first cantilever electrode, a second cantilever electrode and a second pull-up electrode. The array also includes a third micro electromechanical device having a third pull-in electrode coupled to the third word line, a third contact electrode coupled to the second cantilever electrode, a third cantilever electrode and a third pull-up electrode. The array also includes a Vss line coupled to the third cantilever electrode, a first transistor having a first source electrode coupled to the first bit line, a first drain electrode coupled to the first contact electrode and a first gate electrode coupled to the first bit select line and a second transistor having a second source electrode coupled to the first data line, a second drain electrode coupled to each of the first pull-up electrode, the second pull-up electrode and the third pull-up electrode, and a second gate electrode coupled to the first bit select line. The non-volatile NAND array also includes a fourth micro electromechanical device having a fourth pull-in electrode coupled to the first word line, a fourth contact electrode, a fourth pull-up electrode and a fourth cantilever electrode. The array also includes a fifth micro electromechanical device having a fifth pull-in electrode coupled to the second word line, a fifth contact electrode coupled with the fourth cantilever electrode, a fifth cantilever electrode and a fifth pull-up electrode. The array also includes a sixth micro electromechanical device having a sixth pull-in electrode coupled to the third word line, a sixth contact electrode coupled to the fifth cantilever electrode, a sixth cantilever electrode and a sixth pull-up electrode. The array also includes a third transistor having a third source electrode coupled to the first bit line, a third drain electrode coupled to the third contact electrode and a third gate electrode coupled to the first bit select line. The array also includes a fourth transistor having a fourth source electrode coupled to the first data line, a fourth drain electrode coupled to each of the fourth pull-up electrode, the fifth pull-up electrode and the sixth pull-up electrode, and a fourth gate electrode coupled to the first bit select line.

The array may alternatively include a third transistor having a third source electrode coupled to the second bit line, a third drain electrode coupled to the third contact electrode and a third gate electrode coupled to the first bit select line. The array may also alternatively include a fourth transistor having a fourth source electrode coupled to the second data line, a fourth drain electrode coupled to each of the fourth pull-up electrode, the fifth pull-up electrode and the sixth pull-up electrode, and a fourth gate electrode coupled to the first bit select line.

MEMS devices may also be used in AMS chips which are formed in back end of the line (BEOL) compatible processes not affecting any front end of the line (FEOL) devices. Other technologies are in the FEOL or use higher temperatures and non-standard materials, potentially causing issues with devices already created in the FEOL. This is of extra concern for the behavior of analog transistors in the FEOL and therefore this invention enables a much easier integration of this process option in the existing semiconductor processes. The MEMS-based memory can be used for tuning of analog circuits like any other non-volatile memory. The MEMS-based switches can also be used to create non-volatile shift registers. Such non-volatile shift register is a much easier implementation of a tunable analog circuit, requiring far less overhead circuitry. Furthermore it does not require a startup mode to download the information from the memory to the registers prior to entering in its operating mode. Regardless if a memory-based or shift-register based architecture is used, they both have the following advantages over the competing technologies. Low-power, especially applicable to AMS chips in handheld applications, like RF transceivers in GSM phones, battery management chips, etc., native voltage, high temperature and rad-hard (e.g., for any AMS chip used in automotive, military or aerospace applications), and write speed for fast power-up in case of a memory concept.

Embodiments disclosed here relate to using the cantilever-based switches as non-volatile storing elements for the tuning of analog and mixed-signal devices. Each item, which needs to be tuned within an AMS device, requires one or more control signals, which need to be driven by a memory element. One AMS device can contain more than one tunable item. Although, a very complex AMS chip may require more memory elements, typically it will stay well below one thousand memory elements. Therefore the size of the memory element is not the most critical item with respect to such application.

Figure 37:
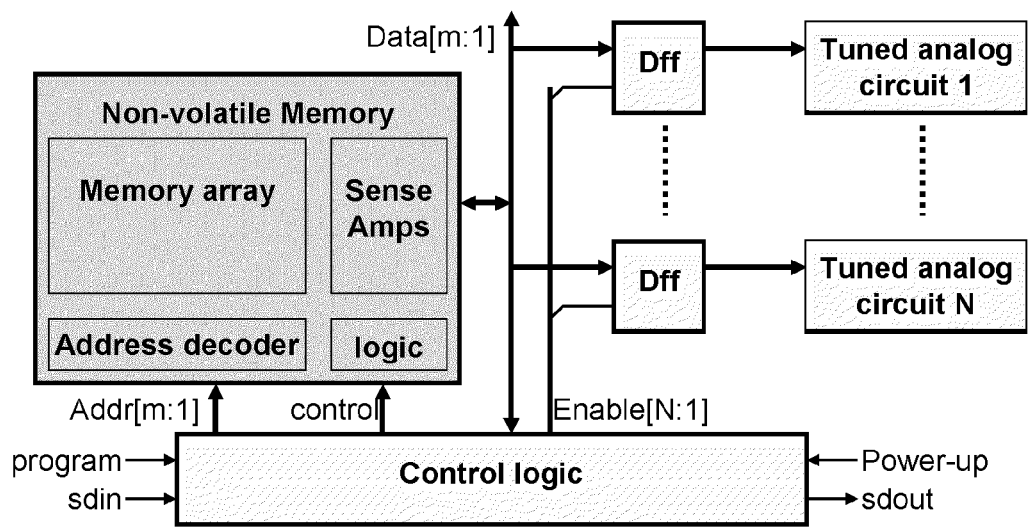
FIG. 37 shows a schematic illustration of an arrangement that provides a continuous signal to each 'tuning transistor' according to one embodiment.

Typically, all transistors in the switching resistor or capacitive network need to be driven continuously. So, each transistor needs to be continuously driven by a memory element. Many memory techniques require a complicated sense amplifier to read out a bit cell. Therefore, memories are organized in arrays and only one word, of any arbitrary length, at the time is read from the memory over a bus. In order to provide a continuous signal to each 'tuning transistor', the memory needs to be read out during power up of the device and transported over the bus system to a volatile memory element, usually referred to as flipflop, where the output of such volatile memory element will continuously drive the transistors in the tuned network. This is schematically described in FIG. 37.

Figure 38:
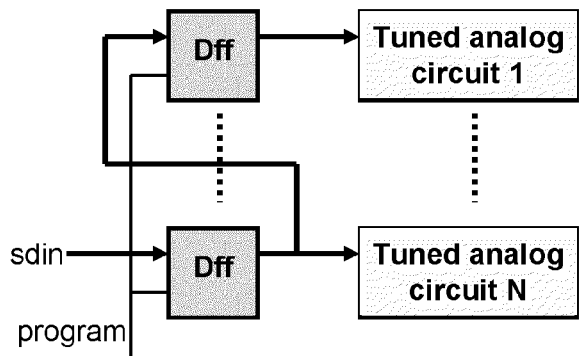
FIG. 38 shows a schematic illustration of an arrangement that provides a continuous signal to each 'tuning transistor' according to another embodiment.

All the prior-art claimed memories store the digital value in an analog manner, either as a low-resistance versus a higher resistance or a low capacitance versus a higher capacitance or a change in threshold of a transistor, which effectively will be measured as a difference in on-resistance of such transistor. The MEMS-switch based memory either has a low resistance when the switch is closed and a near infinite resistance when the switch is off. This opens new possibilities as there will be no current running through a switch in the off-position. This provides the possibility to create a simple non-volatile shift register to be used to tune the analog circuits. Several variants of such shift registers are described below and can be perfectly used to tune the analog circuits. This results in a much simpler schematic as described in FIG. 38

The overhead of memory circuitry plus control logic to detect power-up and subsequently execute a protocol to restore all information over the bus into all flipflops is not required in this schematic. This greatly reduces the amount of circuitry required for tuning the analog circuits. Furthermore, the circuit will be in operating mode immediately after power-up, as it doesn't require a power-up protocol to be executed prior to its operating mode.

Within the chip process technology, the transistors are created during the FEOL processing. There are various types of transistors in an AMS chip, which makes the FEOL a complicated process step, where the different steps do influence the quality of the transistors. Implementing a floating gate technique requires extra process steps in the FEOL to create the special floating gate transistors. Such additional steps will influence the quality of the analog transistors and therefore is a cumbersome integration process. This is why many analog semiconductor processes are not available with a nonvolatile flash process option.

The ferro-electric, magneto-resistive and phase change techniques are implemented after the FEOL and sometimes before the BEOL, but typically require higher process steps than normally used in the BEOL process steps. As high temperature process steps have a big influence on the quality of the transistors, these technologies also tend to have an impact on the quality of the analog behavior of the transistors. Another impact of these techniques is that they use materials, which are not used within a standard semiconductor factory and therefore are a real concern with respect of contamination during processing, causing defect in other parts of the process steps within the factory. The MEMS-based process has a great processing advantage over the competing technologies as it is created within the BEOL without any high temperature process steps, and is not using any obscure materials, which might cause contamination in the factory.

An FPLA is sometimes referred to as a field-programmable gate array (FPGA). An FPLA is a semiconductor device that can be configured by the customer or designer after manufacturing (hence the name field-programmable). FPLAs are programmed using a logic circuit diagram or a source code in a hardware description language (HDL) to specify how the chip will work. They can be used to implement any logical function that an application specific integrated circuit (ASIC) could perform, but the ability to update the functionality after shipping offers advantages for many applications.

FPLAs contain programmable logic components called 'logic blocks', and a hierarchy of reconfigurable interconnects that allow the blocks to be 'wired together', somewhat like a one-chip programmable breadboard. Logic blocks can be configured to perform complex combinational functions, or merely simple logic gates like AND and XOR. In most FPLAs, the logic blocks also include memory elements, which may be simple flip-flops or more complete blocks of memory.

The most common FPLA architecture consists of an array of configurable logic blocks (CLBs), I/O pads, and routing channels. Generally, all the routing channels have the same width (number of wires). Multiple I/O pads may fit into the height of one row or the width of one column in the array.

An application circuit must be mapped into an FPLA with adequate resources. While the number of CLBs and I/Os required is easily determined from the design, the number of routing tracks needed may vary considerably even among designs with the same amount of logic. For example, a crossbar switch requires much more routing than a systolic array with the same gate count. Since unused routing tracks increase the cost and decrease the performance of the part without providing any benefit, FPLA manufacturers try to provide just enough tracks so that most designs that will fit in terms of LUTs and IOs can be routed. This is determined by estimates such as those derived from Rent's rule or by experiments with existing designs.

A classic FPLA logic block consists of a 4-input lookup table (LUT), and a flip-flop. In recent years, manufacturers have started moving to 6-input LUTs in their high performance parts, claiming increased performance. There is only one output, which can be either the registered or the unregistered LUT output. The logic block has four inputs for the LUT and a clock input. Since clock signals (and often other high-fanout signals) are normally routed via special-purpose dedicated routing networks in commercial FPLAs, they and other signals are separately managed.

To define the behavior of the FPLA, the user provides a HDL or a schematic design. The HDL form might be easier to work with when handling large structures because it's possible to just specify them numerically rather than having to draw every piece by hand. On the other hand, schematic entry can allow for easier visualization of a design.

Then, using an electronic design automation tool, a technology-mapped netlist is generated. The netlist can then be fitted to the actual FPLA architecture using a process called place-and-route, usually performed by the FPLA company's proprietary place-and-route software. The user will validate the map, place and route results via timing analysis, simulation, and other verification methodologies. Once the design and validation process is complete, the binary file generated (also using the FPLA company's proprietary software) is used to (re)configure the FPLA.

Going from schematic/HDL source files to actual configuration: The source files are fed to a software suite from the FPLA/CPLD vendor that through different steps will produce a file. This file is then transferred to the FPLA/CPLD via a serial interface (JTAG) or to an external memory device like an EEPROM.

The most common HDLs are VHDL and Verilog, although in an attempt to reduce the complexity of designing in HDLs, which have been compared to the equivalent of assembly languages, there are moves to raise the abstraction level through the introduction of alternative languages.

To simplify the design of complex systems in FPLAs, there exist libraries of predefined complex functions and circuits that have been tested and optimized to speed up the design process. These predefined circuits are commonly called IP cores, and are available from FPLA vendors and third-party IP suppliers (rarely free, and typically released under proprietary licenses). Other predefined circuits are available from developer communities such as OpenCores (typically free, and released under the GPL, BSD or similar license), and other sources.

In a typical design flow, an FPLA application developer will simulate the design at multiple stages throughout the design process. Initially the RTL description in VHDL or Verilog is simulated by creating test benches to simulate the system and observe results. Then, after the synthesis engine has mapped the design to a netlist, the netlist is translated to a gate level description where simulation is repeated to confirm the synthesis proceeded without errors. Finally the design is laid out in the FPLA at which point propagation delays can be added and the simulation run again with these values back-annotated onto the netlist.

Figure 39:
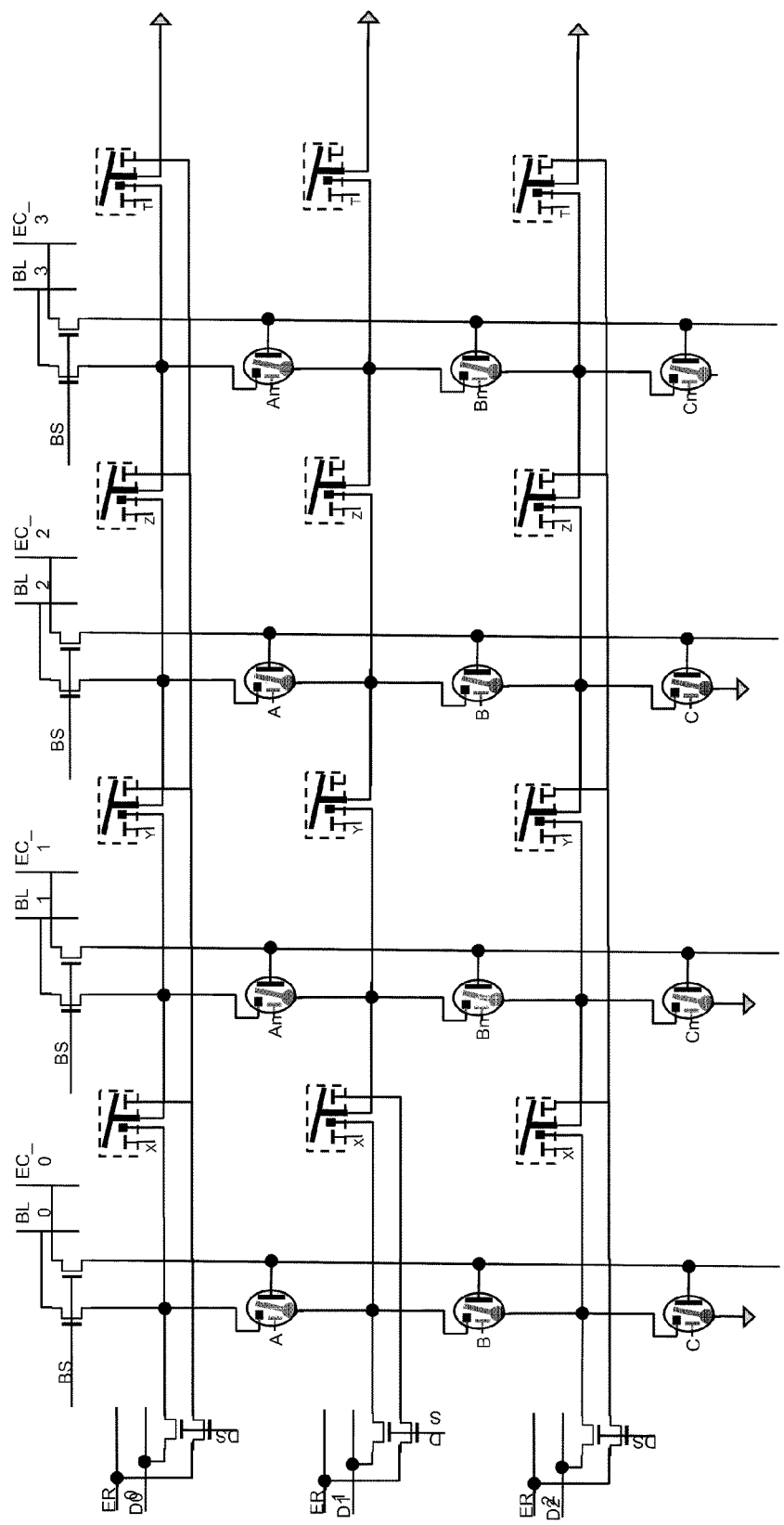
FIG. 39 is a schematic representation of an mFPLA according to one embodiment.
Figure 40:
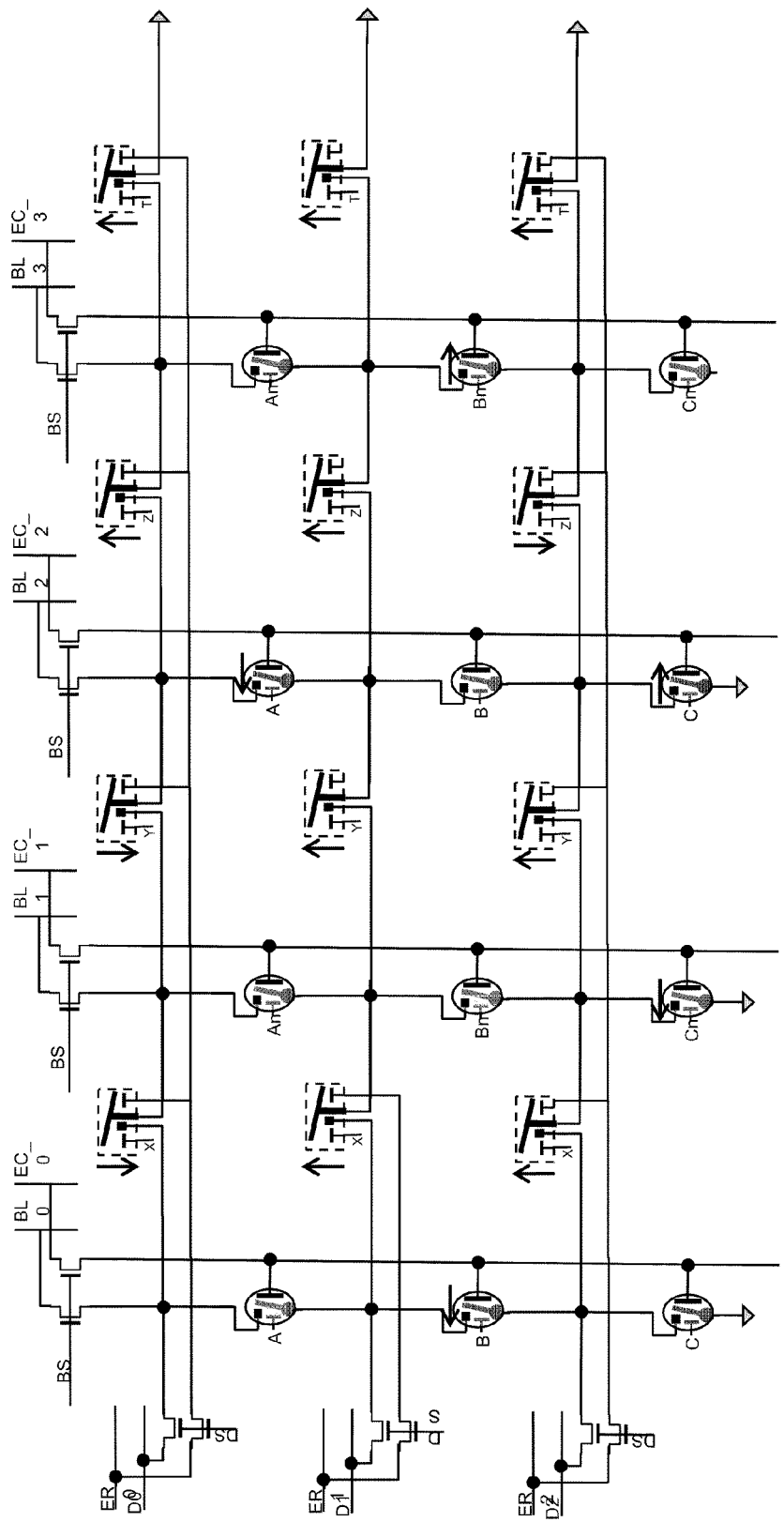
FIGS. 40-43 are schematic illustrations of mFPLAs according to other embodiments.

MEMS may be used in FPLAs. MEMS based FPLAs are referred to as MEMS Field Programmable Logic Arrays (mF-PLA). In the description that follows in regards to FIGS. 39-43, BS is a block select line, ER_# is an erase row line, BL# is a bit line, EC_# is an erase column line, D# is a data line, ED_# is an erase data line, and DS is a data select line. FIG. 39 shows an example of an mFPLA. FIG. 40 shows an example of F=AC+AB+BC. The mFPLA includes a first bit line, a first block select line, a first erase column line, a first erase row line, a first data line and a first data select line. The mFPLA also includes a first transistor having a first source electrode coupled to the bit line, a first drain electrode and a first gate electrode coupled to the block select line. The mFPLA also includes a second transistor having a second source electrode coupled to the erase column line, a second drain electrode and a second gate electrode coupled to the block select line. The mFPLA also includes a third transistor having a third source electrode coupled to the data line, a third drain electrode and a third gate electrode coupled to the data select line. The mFPLA also includes a fourth transistor having a fourth source electrode coupled to the erase row line, a fourth drain electrode and a fourth gate electrode coupled to the data select line. The mFPLA also includes a first micro electromechanical device having a first contact electrode coupled to both the first drain electrode and the third drain electrode, a first pull-in electrode, a first pull-up electrode coupled to the second drain electrode and a first cantilever electrode movable between a position in contact with the first contact electrode and a position spaced form the first contact electrode. The mFPLA also includes a second micro electromechanical device having a second contact electrode, a second pull-in electrode coupled to the first drain electrode and the third drain electrode, a third contact electrode lying in substantially the same plane as the second contact electrode coupled to the fourth drain electrode, and a first rocker electrode movable between positions in contact with the second contact electrode, in contact with the third contact electrode, and spaced from both the second contact electrode and the third contact electrode.

The mFPLA may include a second bit line and a second erase column line. The mFPLA may also include a fifth transistor having a fifth source electrode coupled to the second erase column line, a fifth drain electrode and a fifth gate electrode coupled to the block select line. A sixth transistor having a sixth source electrode coupled to the second bit line, a sixth drain electrode and a sixth gate electrode coupled to the block select line may also be present. A third micro electromechanical element having a fourth contact electrode coupled to the first rocker electrode and the sixth drain electrode, a third pull-in electrode, a third pull-up electrode coupled with the fifth drain electrode, and a second cantilever electrode movable between a position in contact with the fourth contact electrode and a position spaced from the fourth contact electrode may also be present. The mFPLA may also include a fourth micro electromechanical element having a fifth contact electrode, a fourth pull-in electrode coupled with the sixth drain electrode, a sixth contact electrode coupled with the fourth drain electrode, and a second rocker electrode movable between positions in contact with the fifth contact electrode, in contact with the sixth contact electrode, and spaced from both the fifth contact electrode and the sixth contact electrode. The mFPLA may additional include a second erase row line and a second data line. A fifth transistor having a fifth source electrode coupled to the second data line, a fifth drain electrode and a fifth gate electrode coupled to the data select line may also be present. A sixth transistor having a sixth source electrode coupled to the second erase data line, a sixth drain electrode and a sixth gate electrode coupled to the data select line may also be present. A third micro electromechanical element having a fourth contact electrode coupled to the first cantilever electrode and the fifth drain electrode, a third pull-in electrode, a third pull-up electrode coupled with the second drain electrode, and a second cantilever electrode movable between a position in contact with the fourth contact electrode and a position spaced from the fourth contact electrode may also be present. The mFPLA may also include a fourth micro electromechanical element having a fifth contact electrode, a fourth pull-in electrode coupled with the fifth drain electrode, a sixth contact electrode coupled with the sixth drain electrode, and a second rocker electrode movable between positions in contact with the fifth contact electrode, in contact with the sixth contact electrode, and spaced from both the fifth contact electrode and the sixth contact electrode.

Alternatively, the mFPLA may further include a second bit line and a second erase column line. The mFPLA may also include a seventh transistor having a seventh source electrode coupled to the second erase column line, a seventh drain electrode and a seventh gate electrode coupled to the block select line. An eighth transistor having an eighth source electrode coupled to the second bit line, an eighth drain electrode and an eighth gate electrode coupled to the block select line may also be present. A fifth micro electromechanical element having a seventh contact electrode coupled with the eighth drain electrode and the first rocker electrode, a fifth pull-in electrode, a fifth pull-up electrode coupled with the seventh drain electrode, and a fifth cantilever electrode coupled to the second rocker electrode and movable between a position in contact with the seventh contact electrode and a position spaced form the seventh contact electrode may also be present. The mFPLA may also include a sixth micro electromechanical element having an eighth contact electrode, a sixth pull-in electrode coupled to the first rocker electrode, the eighth drain electrode and the seventh contact electrode, the sixth micro electromechanical element also having a ninth contact electrode and a third rocker electrode movable between positions in contact with the eighth contact electrode, in contact with the ninth contact electrode, and spaced from both the eighth contact electrode and the ninth contact electrode.

In FIGS. 39 and 40, there are a plurality of bit lines, a plurality of erase column lines, a plurality of erase row lines and a plurality of data lines. The erase row lines and the data lines are all parallel to each other and perpendicular to the bit lines and the erase column lines. Similarly, the data select line is parallel to the bit lines and the erase column lines, but perpendicular to the block select line, the erase row lines and the data lines.

Figure 41:
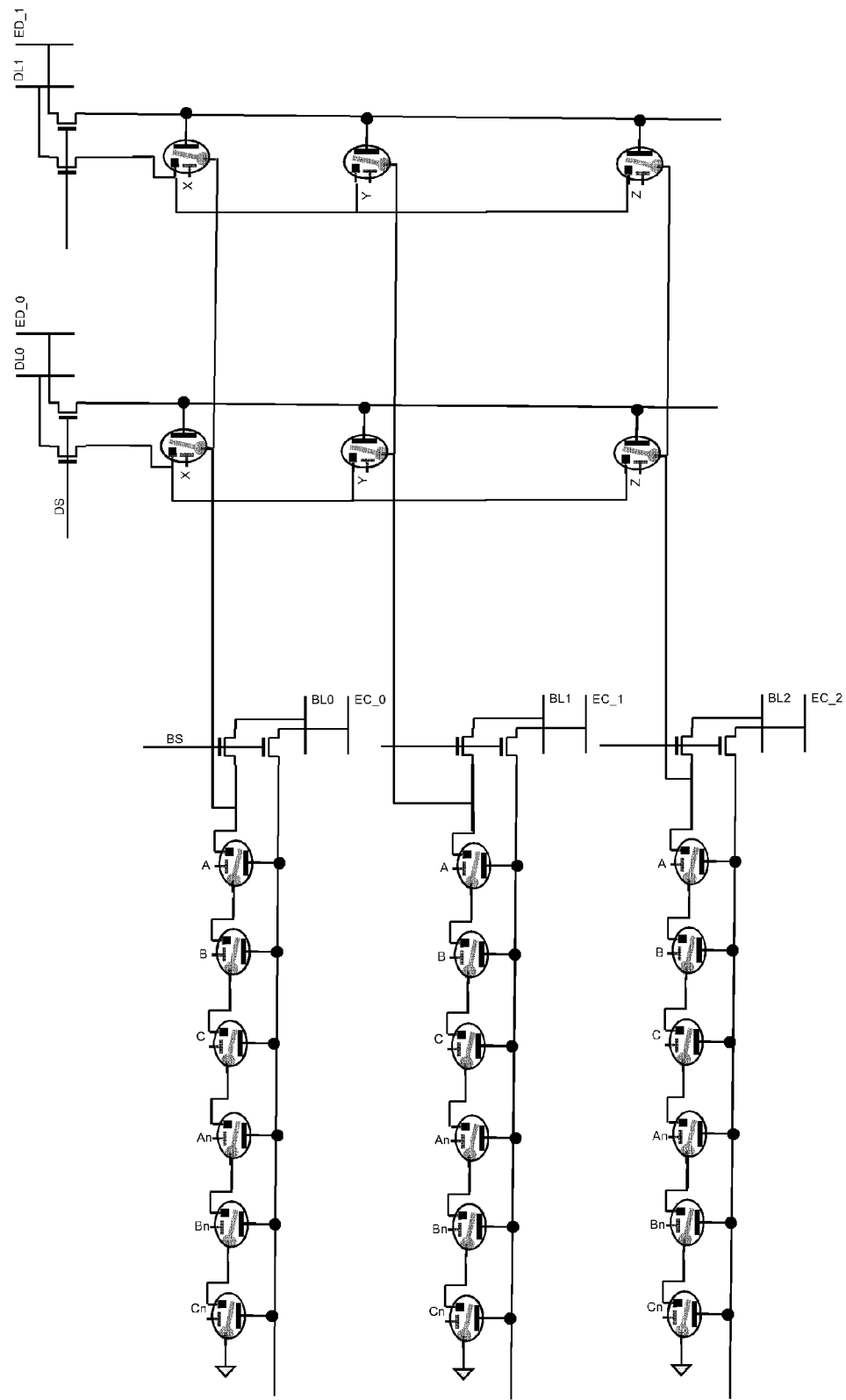
Figure 42:
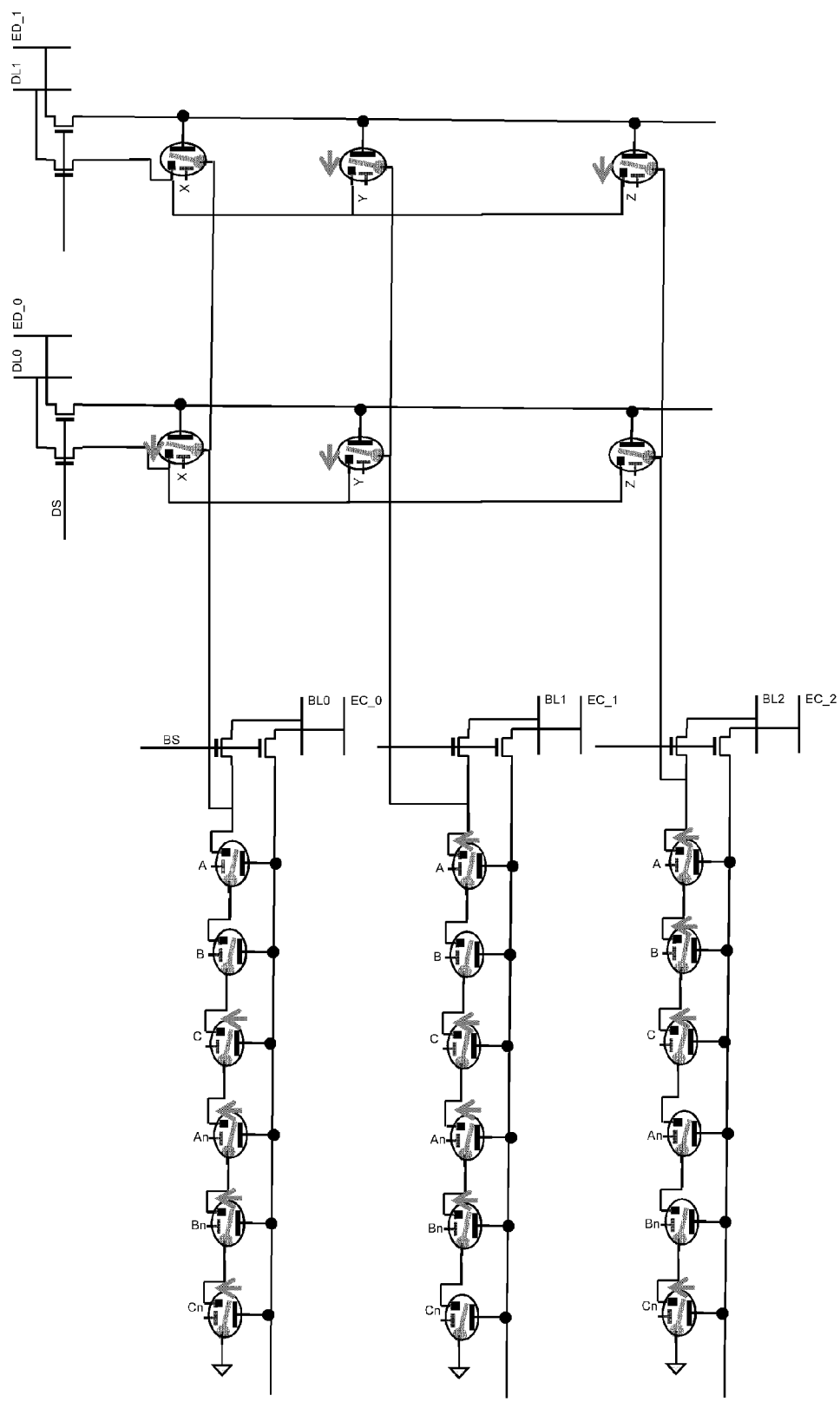
Figure 43:
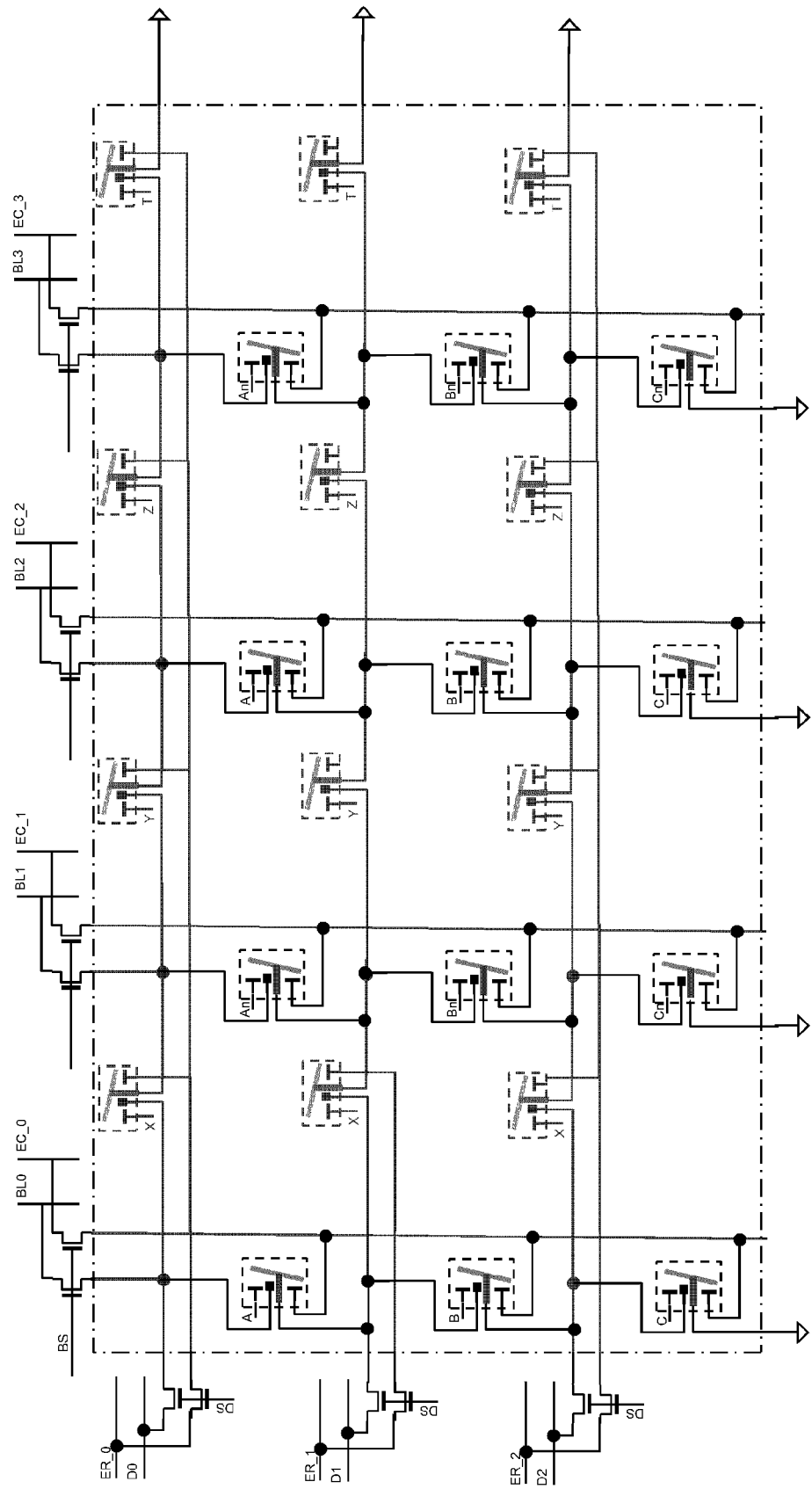

FIGS. 41-43 show other mFPLA embodiments. For FIGS. 41 and 42, the mFPLA includes a first bit line, a first erase column line, a block select line, a first data line, a first erase data line and a data select line. The mFPLA also includes a first transistor having a first source electrode coupled to the first bit line, a first drain electrode and a first gate electrode coupled to the block select line. The mFPLA also includes a second transistor having a second source electrode coupled to the first erase column line, a second drain electrode and a second gate electrode coupled to the block select line. The mFPLA also includes a third transistor having a third source electrode coupled to the first data line, a third drain electrode and a third gate electrode coupled to the data select line. The mFPLA also includes a fourth transistor having a fourth source electrode coupled to the first erase data line, a fourth drain electrode and a fourth gate electrode coupled to the data select line. The mFPLA also includes a first micro electromechanical element having a first contact electrode coupled to the first drain electrode, a first pull-in electrode, a first pull-up electrode coupled to the second drain electrode and a first cantilever electrode movable between a position in contact with the first contact electrode and a position spaced from the first contact electrode. The mFPLA also includes a second micro electromechanical element having a second contact electrode coupled to the first cantilever electrode, a second pull-in electrode, a second pull-up electrode coupled to the second drain electrode and a second cantilever electrode movable between a position in contact with the second contact electrode and a position spaced from the second contact electrode. The mFPLA also includes a third micro electromechanical element having a third contact electrode coupled the third drain electrode, a third pull-in electrode, a third pull-up electrode coupled to the fourth drain electrode and a third cantilever electrode coupled to the first contact electrode and the first drain electrode and movable between a position in contact with the third contact electrode and a position spaced from the third contact electrode.

The mFPLA may include a second data line and a second erase data line. The mFPLA may also include a fifth transistor having a fifth source electrode coupled to the second data line, a fifth drain electrode and a fifth gate electrode coupled to the data select line. A sixth transistor having a sixth source electrode coupled to the second erase data line, a sixth drain electrode and a sixth gate electrode coupled to the data select line may also be present. A fifth micro electromechanical element having a fifth contact electrode coupled to the fifth drain electrode, a fifth pull-in electrode, a fifth pull-up electrode coupled to the sixth drain electrode and a sixth cantilever electrode coupled to the first contact electrode and the first drain electrode, the fifth cantilever electrode movable from a position in contact with the fifth contact electrode and a position spaced from the fifth contact electrode may also be present.

Alternatively, the mFPLA may include a second bit line and a second erase column line. The mFPLA may also include a fifth transistor having a fifth source electrode coupled to the second bit line, a fifth drain electrode and a fifth gate electrode coupled to the block select line. A sixth transistor having a sixth source electrode coupled to the second erase column line, a sixth drain electrode and a sixth gate electrode coupled to the block select line may also be present. The mFPLA may also include a fifth micro electromechanical element having a fifth contact electrode coupled to the fifth drain electrode, a fifth pull-in electrode, a fifth pull-up electrode coupled to the sixth drain electrode, and a sixth cantilever electrode movable between a position in contact with the fifth contact electrode and a position spaced from the fifth contact electrode. A sixth micro electromechanical element having a sixth contact electrode coupled to fifth cantilever electrode, a sixth pull-in electrode, a sixth pull-up electrode coupled to the sixth drain electrode, and a sixth cantilever electrode movable between a position in contact with the sixth contact electrode and a position spaced form the sixth contact electrode may also be present.

The mFPLA may additionally include a second data line and a second erase data line. The mFPLA may also include a seventh transistor having a seventh source electrode coupled to the second data line, a seventh drain electrode and a seventh gate electrode coupled to the data select line. An eighth transistor having an eighth source electrode coupled to the second erase data line, an eighth drain electrode and an eighth gate electrode coupled to the data select line may also be present. The mFPLA may also include a seventh micro electromechanical element having a seventh contact electrode coupled to the seventh drain electrode, a seventh pull-in electrode, a seventh pull-up electrode coupled to the eighth drain electrode and a seventh cantilever electrode coupled to the third cantilever electrode, first contact electrode and first drain electrode, the seventh cantilever electrode movable from a position in contact with the seventh contact electrode and a position spaced form the seventh contact electrode.

In FIGS. 41 and 42, there are a plurality of data lines, a plurality of erase data lines, a plurality of bit lines, a plurality of erase column lines, a block select line and a data select line. The bit lines, erase column lines and the data select lines are all substantially parallel to each other. Similarly, the block select line, the data lines and the erase data lines are all substantially parallel to each other. The block select line, the data lines and the erase data lines are all substantially perpendicular to the bit lines, the erase column lines and the data select line.

For FIG. 43, the mFPLA includes a first bit line, a first erase column line, a first erase row line, a first data line, a block select line and a data select line. The mFPLA also includes a first transistor having a first source electrode coupled to the first bit line, a first drain electrode and a first gate electrode coupled to the block select line. The mFPLA also includes a second transistor having a second source electrode coupled to the erase column line, a second drain electrode and a second gate electrode coupled to the block select line. The mFPLA also includes a third transistor having a third source electrode coupled to the first data line, a third drain electrode and a third gate electrode coupled to the data select line. The mFPLA also includes a fourth transistor having fourth source electrode coupled to the first erase row line, a fourth drain electrode and a fourth gate electrode coupled to the data select line. The mFPLA also includes a first micro electromechanical element having a first contact electrode, a second contact electrode coupled to the second drain electrode and disposed in substantially the same plane as the first contact electrode, a first pull-in electrode coupled to the third drain electrode and the first drain electrode, and a first rocker electrode movable between a position in contact with the first contact electrode, a position in contact with the second contact electrode and a position spaced from both the first contact electrode and the second contact electrode. The mFPLA also includes a second micro electromechanical element having a third contact electrode, a fourth contact electrode coupled to the fourth drain electrode and disposed in substantially the same plane as the third contact electrode, a second pull-in electrode coupled to the third drain electrode, first pull-in electrode and first drain electrode, and a second rocker electrode movable between a position in contact with the third contact electrode, a position in contact with the fourth contact electrode and a position spaced from both the third contact electrode and the fourth contact electrode.

The mFPLA may additionally include a second bit line and a second erase column line. The mFPLA may also include a fifth transistor having a fifth source electrode coupled to the second bit line, a fifth drain electrode and a fifth gate electrode coupled to the bit select line. A sixth transistor having a sixth source electrode coupled to the second erase column line, a sixth drain electrode and a sixth gate electrode coupled to the bit select line may also be present. The mFPLA may also include a third micro electromechanical element having a fifth contact electrode, a sixth contact electrode coupled to the sixth drain electrode and disposed in substantially the same plane as the fifth contact electrode, a third pull-in electrode coupled to the fifth drain electrode and the second rocker electrode, and a third rocker electrode movable between a position in contact with the fifth contact electrode, a position in contact with the sixth contact electrode and a position spaced from both the fifth contact electrode and the sixth contact electrode. A fourth micro electromechanical element having a seventh contact electrode, an eighth contact electrode coupled with the fourth contact electrode and the fourth drain electrode, a fourth pull-in electrode coupled to the fifth drain electrode and the second rocker electrode, and a fourth rocker electrode movable between a position in contact with the seventh contact electrode, a position in contact with the eighth contact electrode and a position spaced from both the seventh contact electrode and the eighth contact electrode may also be present.

Alternatively, the mFPLA may include a second erase row line and a second data line. A fifth transistor having a fifth source electrode coupled to the second data line, a fifth drain electrode and a fifth gate electrode coupled to the data select line may also be present. The mFPLA may also include a sixth transistor having a sixth source electrode coupled to the second erase row line, a sixth drain electrode and a sixth gate electrode coupled to the data select line. A third micro electromechanical element having a fifth contact electrode, a sixth contact electrode disposed in substantially the same plane as the fifth contact electrode and coupled to the first erase column line and the second contact electrode, a third pull-in electrode coupled to the fifth drain electrode and the first rocker electrode, and a third rocker electrode movable between a position in contact with the fifth contact electrode, a position in contact with the sixth contact electrode and a position spaced from both the fifth contact electrode and the sixth contact electrode may also be present. The mFPLA may also include a fourth micro electromechanical element having a seventh contact electrode, an eighth contact electrode coupled to the sixth drain electrode, a fourth pull-in electrode coupled to the third pull-in electrode, the first rocker electrode and the fifth drain electrode, and a fourth rocker electrode movable between a position in contact with the seventh contact electrode a position in contact with the eighth contact electrode and a position spaced from both the seventh contact electrode and the eighth contact electrode.

Additionally, the mFPLA may also include a second bit line and a second erase column line. The mFPLA may also include a seventh transistor having a seventh source electrode coupled to the second bit line, a seventh drain electrode and a seventh gate electrode coupled to the block select line. An eighth transistor having an eighth source electrode coupled to the second erase column line, an eighth drain electrode and an eighth gate electrode coupled to the block select line may also be present. The mFPLA may also include a fifth micro electromechanical element having a ninth contact electrode, a tenth contact electrode coupled to the eighth drain electrode and disposed in substantially the same plane as the ninth contact electrode, a fifth pull-in electrode coupled with the seventh drain electrode and the second rocker electrode, and a fifth rocker electrode coupled with the fourth rocker electrode and movable between a position in contact with the ninth contact electrode, a position in contact with the tenth contact electrode and a position spaced from both the ninth contact electrode and the tenth contact electrode. A sixth micro electromechanical element having an eleventh contact electrode, a twelfth contact electrode coupled to the fourth drain electrode and the fourth contact electrode and disposed in substantially the same plane as the eleventh contact electrode, a sixth pull-in electrode coupled to the seventh drain electrode and the second rocker electrode, and a sixth rocker electrode movable between a position in contact with the eleventh contact electrode, a position in contact with the twelfth contact electrode and a position spaced from both the eleventh contact electrode and the twelfth contact electrode may also be present.

In FIG. 43, there are a plurality of bit lines, a plurality of erase column lines, a plurality or erase row lines, a plurality of data lines, a data select line and a block select line. The data lines, the erase row lines and the block select line are all substantially parallel to each other. The bit lines, the erase column lines and the data select line are all substantially parallel to each other. The bit lines, the erase column lines and the data select line are all substantially perpendicular to the data lines, the erase row lines and the block select line.

By utilizing MEMS devices, logic devices such as FPLAs, NAND, nvSRAM and AMS chips may be fabricated utilizing less chip space without affecting front end of the line (FEOL) processes.

While the foregoing is directed to embodiments of the present invention, other and further embodiments of the invention may be devised without departing from the basic scope thereof, and the scope thereof is determined by the claims that follow.

The invention claimed is:
1. A nvSRAM device, comprising:
   at least one micro electromechanical device having a first contact electrode, a second contact electrode, a first pull-in electrode, a second pull-in electrode, and a rocker electrode movable from a position in contact with the first contact electrode to a position spaced from both the first contact electrode and the second contact electrode to a position in contact with the second contact electrode;
   at least one transistor coupled to the at least one micro electromechanical device;
   a plurality of bit lines coupled to the at least one transistor;
   a VddRow line coupled to the at least one transistor;
   a word line coupled to the at least one transistor;
   a store line coupled to the first pull-in electrode;
   a restore line coupled to one or more of the at least one transistor, the first pull-in electrode and the second pull-in electrode; and
   a Vss line coupled to one or more of the at least one transistor, the rocker electrode and the second contact electrode.

2. The nvSRAM device of claim 1, wherein the at least one transistor comprises:
   a first transistor comprising a first source electrode, a first drain electrode and a first gate electrode;
   a second transistor comprising a second source electrode, a second drain electrode and a second gate electrode;
   a third transistor comprising a third source electrode, a third drain electrode and a third gate electrode;
   a fourth transistor comprising a fourth source electrode, a fourth drain electrode and a fourth gate electrode;
   a fifth transistor comprising a fifth source electrode, a fifth drain electrode and a fifth gate electrode;
   a sixth transistor comprising a sixth source electrode, a sixth drain electrode and a sixth gate electrode;
   a seventh transistor comprising a seventh source electrode, a seventh drain electrode and a seventh gate electrode; and
   an eighth transistor comprising an eighth source electrode, an eighth drain electrode and an eighth gate electrode.

3. The nvSRAM device of claim 2, wherein the seventh source electrode, the third source electrode, the fourth source electrode and the second pull-in electrode are each coupled to the Vss line.

4. The nvSRAM device of claim 2, wherein the seventh gate electrode and the eighth gate electrode are each coupled to the Restore line.

5. The nvSRAM device of claim 2, wherein the first pull-in electrode is coupled to the Store line.

6. The nvSRAM device of claim 2, wherein the fifth gate electrode and the sixth gate electrode are each coupled to the word line.

7. The nvSRAM device of claim 2, wherein the first source electrode, the second source electrode and the eighth source electrode are each coupled to the VddRow line.

8. The nvSRAM device of claim 2, wherein the fifth source electrode and the sixth source electrode are each coupled to separate bit lines.

9. The nvSRAM device of claim 2, wherein the fifth drain electrode, the rocker electrode, the first drain electrode, the third drain electrode, the second gate electrode and the fourth gate electrode are all coupled together.

10. The nvSRAM device of claim 2, wherein the first gate electrode, the third gate electrode, the second drain electrode, the fourth drain electrode and the sixth drain electrode are all coupled together.

11. The nvSRAM device of claim 2, wherein the seventh drain electrode is coupled to the first contact electrode and wherein the eighth drain electrode is coupled to the second contact electrode.

12. The nvSRAM device of claim 2, wherein the plurality of bit lines are parallel to each other and perpendicular to the VddRow line, the word line, the Store line, the Restore line and the Vss line.

13. A NAND-based non-volatile memory architecture, comprising:
- a first micro electromechanical device having a first pull-up electrode, a first pull-in electrode, a first contact electrode and a first cantilever electrode movable between a position in contact with the first contact electrode and a position spaced from the first contact electrode;
- a second micro electromechanical device having a second pull-up electrode, a second pull-in electrode, a second contact electrode and a second cantilever electrode movable between a position in contact with the second contact electrode and a position spaced from the second contact electrode, the second cantilever electrode is coupled to the first contact electrode;
- a first word line coupled to the first pull-in electrode;
- a second word line coupled to the second pull-in electrode;
- a Vss line coupled to the first cantilever electrode; and
- a transistor coupled to the second micro electromechanical device.

14. The NAND-based non-volatile memory architecture of claim 13, wherein the transistor comprises a drain electrode coupled to the second contact electrode, a gate electrode and a source electrode.

15. The NAND-based non-volatile memory architecture of claim 14, further comprising:
- a bit select line coupled to the gate electrode; and
- a bit line coupled to the source electrode.

16. The NAND-based non-volatile memory architecture of claim 14, further comprising a data line coupled to the first pull-up electrode and the second pull-up electrode.

17. A micro electromechanical field programmable logic array, comprising:
- a first bit line;
- a first block select line;
- a first erase column line;
- a first erase row line;
- a first data line;
- a first data select line;
- a first transistor having a first source electrode coupled to the bit line, a first drain electrode and a first gate electrode coupled to the block select line;
- a second transistor having a second source electrode coupled to the erase column line, a second drain electrode and a second gate electrode coupled to the block select line;
- a third transistor having a third source electrode coupled to the data line, a third drain electrode and a third gate electrode coupled to the data select line;
- a fourth transistor having a fourth source electrode coupled to the erase row line, a fourth drain electrode and a fourth gate electrode coupled to the data select line;
- a first micro electromechanical device having a first contact electrode coupled to both the first drain electrode and the third drain electrode, a first pull-in electrode, a first pull-up electrode coupled to the second drain electrode and a first cantilever electrode movable between a position in contact with the first contact electrode and a position spaced form the first contact electrode; and
- a second micro electromechanical device having a second contact electrode, a second pull-in electrode coupled to the first drain electrode and the third drain electrode, a third contact electrode lying in substantially the same plane as the second contact electrode coupled to the fourth drain electrode, and a first rocker electrode movable between positions in contact with the second contact electrode, in contact with the third contact electrode, and spaced from both the second contact electrode and the third contact electrode.

18. The micro electromechanical field programmable logic array of claim 17, further comprising:
- a second erase row line;
- a second data line;
- a fifth transistor having a fifth source electrode coupled to the second data line, a fifth drain electrode and a fifth gate electrode coupled to the data select line;
- a sixth transistor having a sixth source electrode coupled to the second erase data line, a sixth drain electrode and a sixth gate electrode coupled to the data select line;
- a third micro electromechanical element having a fourth contact electrode coupled to the first cantilever electrode and the fifth drain electrode, a third pull-in electrode, a third pull-up electrode coupled with the second drain electrode, and a second cantilever electrode movable between a position in contact with the fourth contact electrode and a position spaced from the fourth contact electrode;
- a fourth micro electromechanical element having a fifth contact electrode, a fourth pull-in electrode coupled with the fifth drain electrode, a sixth contact electrode coupled with the sixth drain electrode, and a second rocker electrode movable between positions in contact with the fifth contact electrode, in contact with the sixth contact electrode, and spaced from both the fifth contact electrode and the sixth contact electrode.

19. The micro electromechanical field programmable logic array of claim 18, further comprising:
- a second bit line;
- a second erase column line;
- a seventh transistor having a seventh source electrode coupled to the second erase column line, a seventh drain electrode and a seventh gate electrode coupled to the block select line;
- an eighth transistor having an eighth source electrode coupled to the second bit line, an eighth drain electrode and an eighth gate electrode coupled to the block select line;
- a fifth micro electromechanical element having a seventh contact electrode coupled with the eighth drain electrode and the first rocker electrode, a fifth pull-in electrode, a fifth pull-up electrode coupled with the seventh drain electrode, and a fifth cantilever electrode coupled to the second rocker electrode and movable between a position in contact with the seventh contact electrode and a position spaced form the seventh contact electrode; and a sixth micro electromechanical element having an eighth contact electrode, a sixth pull-in electrode coupled to the first rocker electrode, the eighth drain electrode and the seventh contact electrode, the sixth micro electromechanical element also having a ninth contact electrode and a third rocker electrode movable between positions in contact with the eighth contact electrode, in contact with the ninth contact electrode, and spaced from both the eighth contact electrode and the ninth contact electrode.

20. The micro electromechanical field programmable logic array of claim 17, further comprising:

a second bit line;

a second erase column line;

a fifth transistor having a fifth source electrode coupled to the second erase column line, a fifth drain electrode and a fifth gate electrode coupled to the block select line;

a sixth transistor having an sixth source electrode coupled to the second bit line, a sixth drain electrode and a sixth gate electrode coupled to the block select line;

a third micro electromechanical element having a fourth contact electrode coupled to the first rocker electrode and the sixth drain electrode, a third pull-in electrode, a third pull-up electrode coupled with the fifth drain electrode, and a second cantilever electrode movable between a position in contact with the fourth contact electrode and a position spaced from the fourth contact electrode;

a fourth micro electromechanical element having a fifth contact electrode, a fourth pull-in electrode coupled with the sixth drain electrode, a sixth contact electrode coupled with the fourth drain electrode, and a second rocker electrode movable between positions in contact with the fifth contact electrode, in contact with the sixth contact electrode, and spaced from both the fifth contact electrode and the sixth contact electrode.

* * * * *